(12) United States Patent
Aruga et al.

(10) Patent No.: US 7,952,509 B2
(45) Date of Patent: May 31, 2011

(54) SUCCESSIVE APPROXIMATION A/D CONVERTER

(75) Inventors: Kenta Aruga, Shinjuku (JP); Suguru Tachibana, Shinjuku (JP); Koji Okada, Shinjuku (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/620,546

(22) Filed: Nov. 17, 2009

(65) Prior Publication Data
US 2010/0188277 A1 Jul. 29, 2010

(30) Foreign Application Priority Data

Jan. 26, 2009 (JP) ................................. 2009-014703

(51) Int. Cl.
*H03M 1/34* (2006.01)
(52) U.S. Cl. ........................................ 341/163; 341/155
(58) Field of Classification Search .................. 341/144, 341/155, 172, 163, 150, 161, 154
See application file for complete search history.

(56) References Cited

U.S. PATENT DOCUMENTS

| 4,764,750 | A | | 8/1988 | Kawada | |
|---|---|---|---|---|---|
| 5,185,607 | A | * | 2/1993 | Lyon et al. | 341/120 |
| 6,297,759 | B1 | * | 10/2001 | Lewyn | 341/150 |
| 7,265,708 | B2 | * | 9/2007 | Mitra et al. | 341/172 |
| 7,642,945 | B2 | * | 1/2010 | Tachibana et al. | 341/163 |
| 2002/0041245 | A1 | * | 4/2002 | Brownlow et al. | 341/145 |

FOREIGN PATENT DOCUMENTS

| JP | H07-61019 | B | 6/1995 |
|---|---|---|---|
| JP | 2004-32089 | A | 1/2004 |
| JP | 2004-80075 | A | 3/2004 |
| JP | 2006-54684 | A | 2/2006 |
| JP | 2007-142863 | A | 6/2007 |

OTHER PUBLICATIONS

Analog Devices, Inc., "12-bit R/D Converter with Reference Oscillator",ASD2S1200 Data Sheet, Analog Devices, Norwood, MA 2002.
Linear Technology Chronicle, "Motor/Motion Control",*Linear Technology Chronicle Applicatiooon Note* vol. 13, No. 3, 2004.
Microchip Technology Inc., "dsPIC30F6010A/6015",*Microchip Technology Data Sheet* , 2007.
Microchip Technology Inc., "Sensorless Field Oriented Control of PMSM Motors",*Microchip Technology Application Note*, AN1078 , 2007.
Murray, Aengus et al., "Resolver Position Sensing System with Integrated Fault Detection for Automotive Applications",*Proceedings of IEEE Sensors 2002* , 864-869.

* cited by examiner

*Primary Examiner* — Peguy JeanPierre
(74) *Attorney, Agent, or Firm* — Fujitsu Patent Center

(57) ABSTRACT

A successive approximation A/D conversion circuit for simultaneously sampling N channels of analog signals and for A/D converting the sampled analog signals, includes: N capacitive main DACs; a resistive sub DAC; N comparators; and a successive approximation control circuit, wherein the successive approximation control circuit determines high-order bit values of A/D conversion results of the N channels of analog signals by controlling the N capacitive main DACs and the N comparators, and determines low-order bit values of the A/D conversion results of the N channels of analog signals by controlling the resistive sub DAC and the N comparators.

4 Claims, 32 Drawing Sheets

Prior Art

Prior Art

|  | PRIOR ART (FIG. 2) | PRIOR ART (FIG. 3) | 1st EMBODIMENT |
|---|---|---|---|
| A NUMBER OF CAPACITIVE ELEMENTS | 3 | 4 | 3 |
| A NUMBER OF RESISTORS | 3 | 1 | 1 |
| A NUMBER OF COMPARATORS | 3 | 1 | 3 |
| A NUMBER OF SUCCESSIVE APPROXIMATION CONTROL CIRCUITS | 3 | 1 | 1 |
| A NUMBER OF AMPLIFIERS INCLUDED IN THE SAMPLE-AND-HOLD CIRCUITS | 0 | 3 | 0 |

SUCCESSIVE APPROXIMATION A/D CONVERTER

CROSS-REFERENCE TO RELATED APPLICATIONS

This application is based upon and claims the benefit of priority of the prior Japanese Patent Application No. 2009-014703, filed on Jan. 26, 2009, the entire contents of which are incorporated herein by reference.

FIELD

The embodiments described herein relate to a successive approximation A/D converter having a function for simultaneously sampling a plurality of analog signals.

BACKGROUND

Successive approximation A/D converters are widely used in many applications, because they can be implemented with relatively simple circuitry, have excellent compatibility with CMOS processes, can be manufactured at relatively low cost, and can achieve a relatively fast conversion time. For example, in recent years, advanced electronic control techniques have come to be used to drive motors, and successive approximation A/D converters are used as important component parts in some of such systems.

In applications such as motor control, an A/D converter is used in a feedback loop. Successive approximation A/D converters are suitable for such applications because their latency is relatively small and because there is a direct correspondence between input analog data and output data. Other A/D conversion schemes, such as the delta-sigma scheme, are not suitable for such applications because there is no direct correspondence between input analog data and output data.

Of various types of successive approximation A/D converters, a double-stage type can implement a high-resolution A/D converter with a relatively small chip area. A double-stage successive approximation A/D converter comprises a main DAC which determines high-order bit values and a sub DAC which determines low-order bit values. For the main DAC and sub DAC, a capacitor array or resistor array is used, or they may be used in combination. A successive approximation A/D converter disclosed in an embodiment herein is one that uses a capacitor array for the main DAC and a resistor array for the sub DAC.

FIG. 1 is a diagram showing a circuit example of a 10-bit successive approximation A/D converter that uses a capacitor array for the main DAC and a resistor array for the sub DAC.

The successive approximation A/D converter of FIG. 1 comprises a main DAC (MDAC) which includes a capacitor array of C0' and C0 to C4 and a switch array of SM0' and SM0 to SM4, a sub DAC (DSUB) which includes a resistor array of RS0, RS1, ..., RS31 and a switch array of SS0, SS1, ..., SS31, a comparator CMP, and a successive approximation control circuit (SAR LOGIC) SAR. The successive approximation A/D converter samples an input voltage Vin and, after determining the values of the high-order five bits using the main DAC, determines the values of the low-order five bits using the sub DAC.

The configuration and operation of the successive approximation A/D converter of FIG. 1 are well known, and therefore a further detailed description thereof will not be given here.

In the successive approximation A/D converter of FIG. 1, the capacitive main DAC has the responsibility of sampling and holding an analog signal as well as the responsibility of performing the A/D conversion of the signal.

In applications to motor control or the like, it may become necessary to simultaneously sample signals from a plurality of channels, that is, to sample the values of a plurality of analog signals at the same time instant, and to convert them into digital form. There are two methods for accomplishing the simultaneous sampling from the plurality of channels: one is a simple method that provides as many A/D converters as there are channels to be sampled (the first method) and the other is a method that provides a single A/D converter and as many sample-and-hold circuits as there are channels to be sampled (the second method).

FIG. 2 is a diagram showing a circuit configuration for performing three-channel simultaneous sampling using the first method. The circuit of FIG. 2 comprises three successive approximation A/D converters ADCA, ADCB, and ADCC, each having the same configuration as that shown in FIG. 1.

Each successive approximation A/D converter takes up a relatively large chip area because the area of the capacitive main DAC is large. Accordingly, the circuit configuration of FIG. 2, which requires the provision of as many A/D converters of relatively large size as there are channels to be sampled, has had the problem that the circuit takes up a large silicon area and the manufacturing cost is high.

FIG. 3 is a diagram showing a circuit configuration for performing three-channel simultaneous sampling using the second method. The circuit of FIG. 3 comprises three sample-and-hold circuits (S/Hs) SHA, SHB, and SHC, a switch SD, and one successive approximation A/D converter ADC which has the same configuration as that shown in FIG. 1.

The circuit configuration of FIG. 3 has only one A/D converter, but requires the provision of as many sample-and-hold circuits as there are channels. Each sample-and-hold circuit uses a capacitive element, but this capacitive element takes up substantially the same area as the capacitive main DAC; accordingly, the circuit configuration of FIG. 3 also has had the problem that the circuit takes up a large silicon area and the manufacturing cost is high.

Further, the sample-and-hold circuits of FIG. 3 each require the use of an amplifier because an electric charge must be supplied to the main DAC when ADC performs sampling. Since this amplifier usually cannot amplify voltages near the power rails, the sample-and-hold circuit cannot process input signals near the power rails, and hence the problem that the input voltage range is narrow.

Related Documents

Japanese Laid-open Patent Publication No. 2004-32089
Japanese Laid-open Patent Publication No. 2004-80075
Japanese Laid-open Patent Publication No. 2007-142863
Japanese Laid-open Patent Publication No. H07-61019
Japanese Laid-open Patent Publication No. 2006-54684
"Linear Technology Chronicle, Motor/Motion Control," Linear Technology Chronicle Application Note Vol. 13, No. 3
"Sensorless Field Oriented Control of PMSM Motors," Microchip Technology Application Note, AN1078
"dsPIC30F6010A/6015," Microchip Technology Data Sheet
Murray. A, Hare. B, Hirao. A, "Resolver Position Sensing System with Integrated Fault Detection for Automotive Applications," Proceedings of IEEE Sensors 2002, pp. 864-869.

"12-bit R/D Converter with Reference Oscillator," ADS2S1200 Data Sheet, Analog Devices, Norwood, Mass. 2002.

SUMMARY

According to an aspect of the embodiments, a successive approximation A/D conversion circuit for simultaneously sampling N channels of analog signals and for A/D converting the sampled analog signals, includes: N capacitive main DACs; a resistive sub DAC; N comparators; and a successive approximation control circuit, wherein the successive approximation control circuit determines high-order bit values of A/D conversion results of the N channels of analog signals by controlling the N capacitive main DACs and the N comparators, and determines low-order bit values of the A/D conversion results of the N channels of analog signals by controlling the resistive sub DAC and the N comparators.

The object and advantages of the embodiments will be realized and attained by means of the elements and combination particularly specified in the claims.

It is to be understood that both the foregoing general description and the following detailed description are exemplary and explanatory, and are not restrictive of the invention as claimed.

DESCRIPTION OF EMBODIMENTS

As described above, the successive approximation A/D converters designed to simultaneously sample from a plurality of channels have had the problem that, as the number of channels increases, the circuit area increases correspondingly.

There is therefore a need for a successive approximation A/D converter that has a plurality of channels capable of simultaneous sampling and that can be implemented with a small circuit area and yet provide a wide input voltage range.

Figure 4:
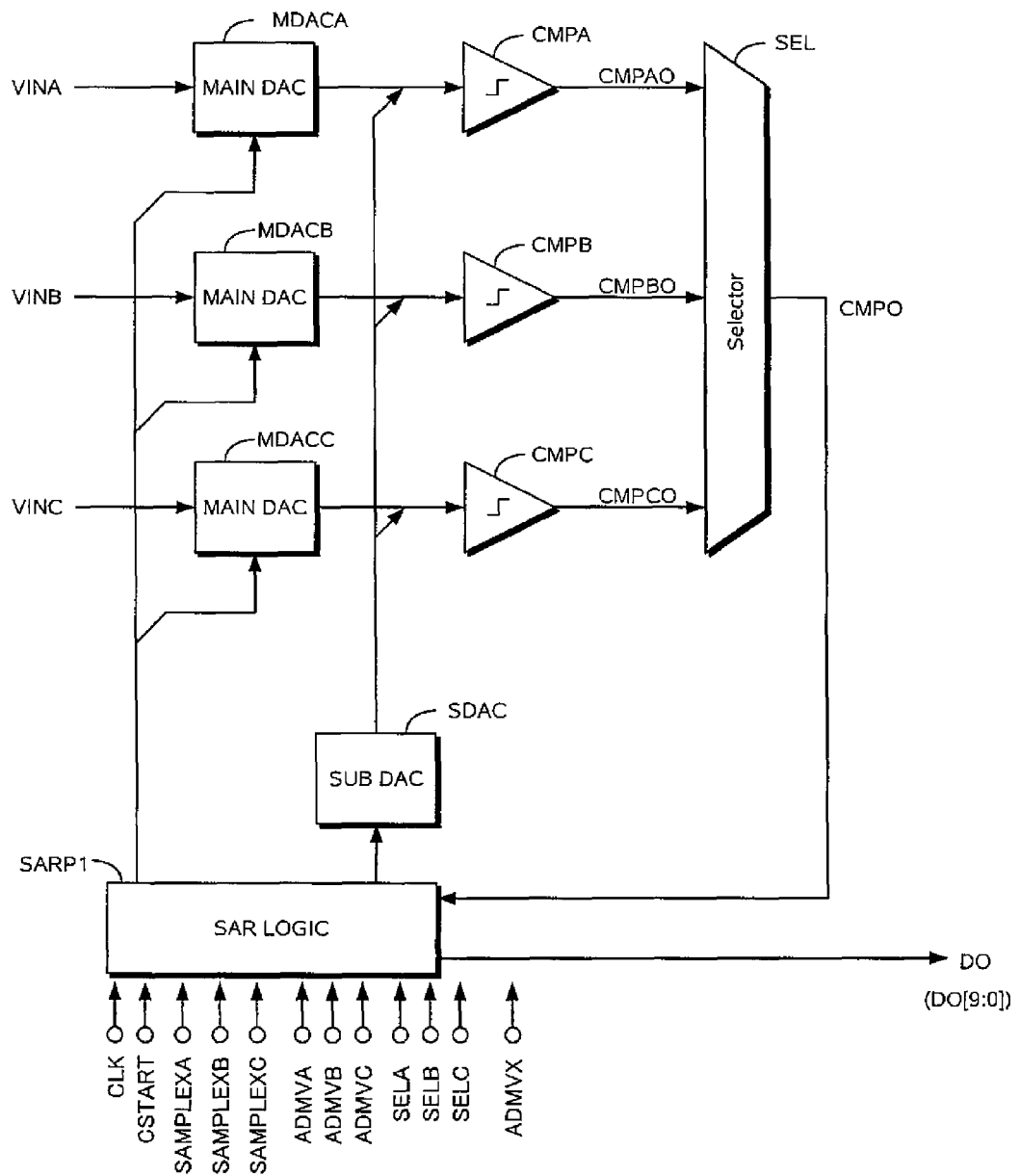
FIG. 4 is a diagram showing the configuration of a successive approximation A/D converter having a multiple-channel simultaneous sampling function according to a first embodiment.

FIG. 4 is a functional block diagram schematically showing the configuration of a successive approximation A/D converter capable of three-channel simultaneous sampling according to a first embodiment.

As shown in FIG. 4, the successive approximation A/D converter of the first embodiment comprises three main DACs MDACA, MDACB, and MDACC, three comparators CMPA, CMPB, and CMPC, one sub DAC SDAC, a successive approximation control circuit (SAR LOGIC) SARP1, and a selector for selecting the outputs of the three comparators one at a time for connection to the successive approximation control circuit.

In FIG. 4, VINA, VINB, and VINC designate the analog input signals from the three channels A to C, and CMPAO, CMPBO, and CMPCO designate the outputs of the respective comparators CMPA, CMPB, and CMPC, while DO designates a 10-bit digital signal produced by A/D conversion. The three main DACs are respectively paired with the three comparators.

In FIG. 4, the following control signals are input to the successive approximation control circuit SARP1. CLK is a clock signal, CSTART is a signal for directing the execution of a successive approximation, SAMPLEXA to SAMPLEXC are signals for directing the execution of sampling of the channels A to C, respectively, ADMVA to ADMVC are signals for directing the A/D converters on the respective channels A to C to operate (control signals for operating the respective comparators), SELA to SELC are signals for directing the selection state of the selector, and ADMVX is a signal for directing the A/D converter to operate (a control signal for operating SDAC).

Figure 5:
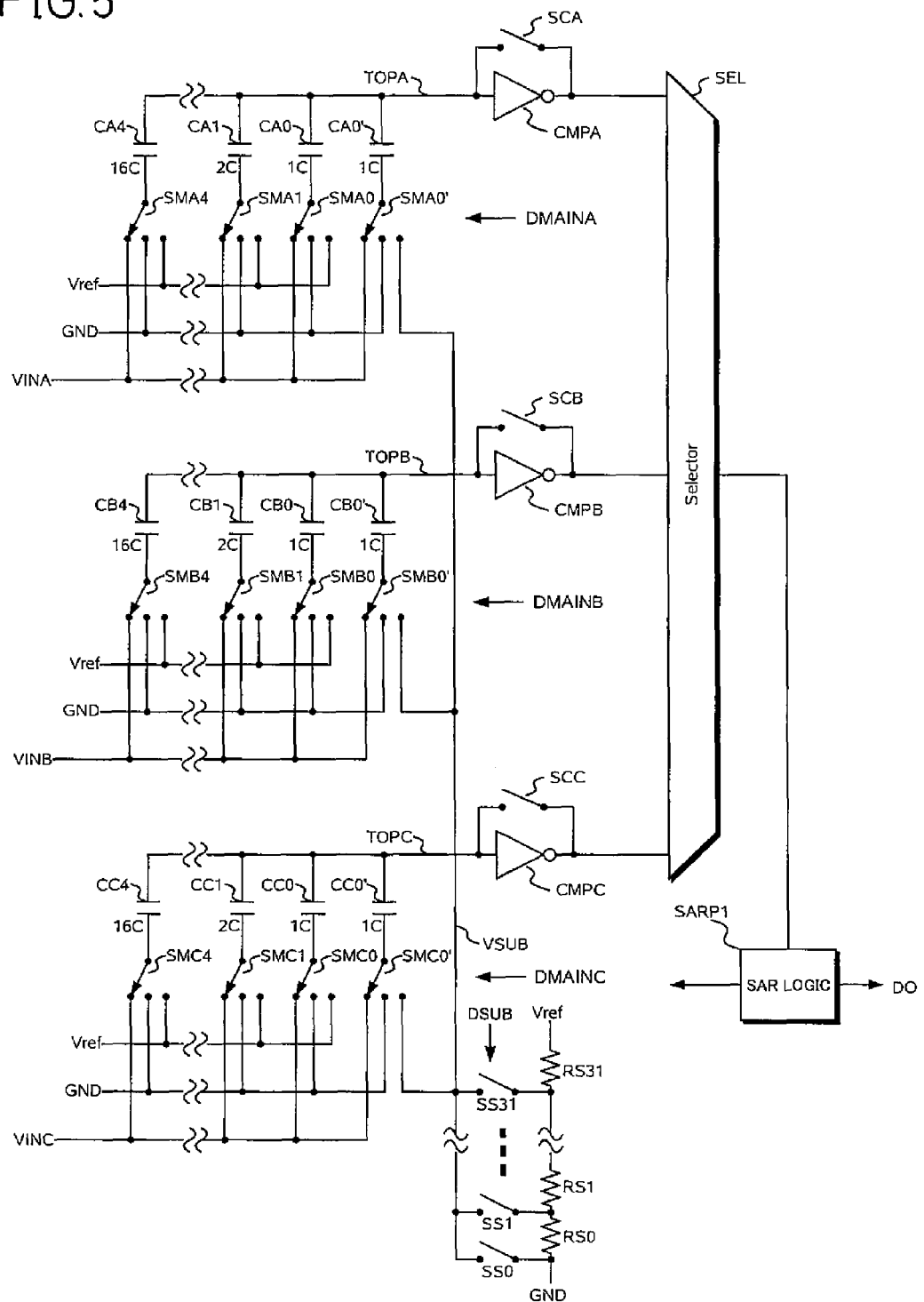
FIG. 5 is a diagram showing in further detail the configuration of the successive approximation A/D converter according to the first embodiment.

FIG. 5 is a diagram showing in further detail the circuit configuration of the section containing the three main DACs, three comparators, and sub DAC in the successive approximation A/D converter of the first embodiment. Since the main DACs and the comparators are respectively identical in configuration, the following description deals with the channel A main DACA and the channel A comparator CMPA.

DACA includes binary-weighted capacitive elements CA0', CA0, CA1, . . . , CA4, and switches SMA0', SMA0, SMA1, . . . , SMA4 connected to the bottom plates of the respective capacitive elements and controlled by a main-control digital code DMAINA. The top plates of the capacitive elements CA0', CA0, CA1, . . . , CA4 are connected in common to a node TOP. The capacitive elements CA0', CA0, CA1, . . . , CA4 have binary-weighted capacitance values. Specifically, denoting the capacitance value by C, the capacitance values of CA0' and CA0 are each given as 1C, the capacitance value of CA1 is given as 2C, the capacitance value of CA2 is given as 4C, the capacitance value of CA3 is given as 8C, and the capacitance value of CA4 is given as 16C. The capacitive elements CA1, . . . , CA4, excluding the capacitive elements CA0' and CA0, are each implemented by connecting a corresponding number of unit capacitive elements each having, for example, a capacitance value of 1C.

The switches SMA0', SMA0, SMA1, . . . , SMA4 connect the bottom plates of the corresponding capacitive elements CA0', CA0, CA1, . . . , CA4 to the A/D conversion reference voltage Vref when the corresponding bit in DMAINA is set to "1", and to GND when the corresponding bit is set to "0". When sampling, the switches SMA0', SMA0, SMA1, . . . , SMA4 connect the bottom plates of the corresponding capacitive elements CA0', CA0, CA1, . . . , CA4 to the input terminal of the channel A irrespectively of the value of DMAINA. For example, when DMAIN=10000, SMA4 is connected to Vref, and SM3 to SM0 and SM0' are all connected to GND.

A switch SCA is provided between the input and output of CMPA.

The sub DAC includes a resistor string consisting of 32 resistors RS0, RS1, . . . , RS31 connected in series between Vref and GND, and 32 switches SS0, SS1, . . . , SS31 connected between the output VSUB of the sub DAC and the connection nodes of the respective resistors and controlled by a sub-control digital code DSUB. The sub-control digital code DSUB is a digital binary code and, in accordance with the value of the code, one of the switches SS0, SS1, . . . , SS31 is connected to output the voltage of the corresponding node onto the sub DAC output VSUB. In the example of FIG. 5, the relation VSUB=(value of DSUB/32)×Vref holds. For example, when DSUB=10000 (binary)=16 (decimal), VSUB=(½)Vref is output.

In the following description, device names beginning with C indicate capacitive elements, device names beginning with S indicate switches, device names beginning with R indicate resistors, and device names beginning with SAR indicate successive approximation control circuits, unless specifically stated otherwise, and descriptions thereof may be omitted hereinafter.

First, the successive approximation A/D conversion process performed using the main DACA, CMPA, and sub DAC will be described.

The A/D conversion is performed by first sampling the analog signal and then performing successive approximation conversion. When sampling, first the switches SMA0', SMA0, SMA1, . . . , SMA4 in the main DAC are all connected to VINA, and the switch SCA is closed. When the switches SMA0', SMA0, SMA1, . . . , SMA4 are connected to VINA, the bottom plate of the capacitor array is brought to the same potential as VINA. When the switch SCA is closed, the top plate of the capacitor array is brought to a potential approximately equal to one half of the supply voltage. Specifically, an electric charge proportional to the analog input voltage VINA is stored in the capacitor array. Next, SCA is opened, and the stored charge is thus held in the capacitor array.

With the switch SCA kept open, DMAINA is set to 10000 (binary), thereby connecting SM0' to GND. Thereupon, the potential of the top plate of the capacitor array changes, and the comparator makes a decision on the digital value to determine whether it is a 1 or a 0. When the potential of the top plate rises, the most significant bit of DMAINA is set to 0, but when it falls, the most significant bit of DMAINA is set to 1. Next, the second significant bit of DMAINA is set to 1. Thereupon, the potential of the top plate changes, and the comparator makes a decision on the digital value to determine whether it is a 1 or a 0. When the potential of the top plate rises, the second significant bit of DMAINA is set to 0, but when it falls, the second significant bit of DMAINA is set to 1. This operation is performed successively until the least significant bit of DMAINA is determined. After the value of DMAINA has been determined, SMA0' is connected to VSUB, and in DSUB, as in DMAINA, the successive approximation is repeated until the least significant bit is reached. The value obtained by concatenating the finally obtained values of DMAINA and DSUB represents the digital value corresponding to VINA. For example, when DMAINA=10000 and DSUB=00001, the digital value corresponding to VINA is 1000000001. The A/D conversion is accomplished by the above sequence of operations.

When determining each bit value of DMAINA and DSUB, a "binary search" method is used in order to shorten the processing time. This method is well known, and therefore will not be further described herein.

The above process is equivalent to searching for a digital code corresponding to the signal voltage of the analog input signal by a binary search.

The relationship between the charge stored in the capacitive DAC during sampling and the potential of the top plate during successive approximation will be described in further detail below.

During sampling, the potential of the top plate TOPA is the same as the logic threshold VTL of the comparator CMPA. With TOPA held at the same potential as the logic threshold VTL of CMPA, the switches SMA0', SMA0, SMA1, ..., SMA4 in FIG. 5 are operated to connect the bottom plates of CA0', CA0, CA1, ..., CA4 to VINA. In this way, by holding the node TOPA at the same potential as the logic threshold VTL and applying the analog input signal potential VINA to the bottom plates of the capacitors CA0' and CA0 to CA4, the analog input signal potential VINA is sampled, and the capacitors CA0' and CA0 to CA4 are charged in proportion to VINA.

The charge Q stored in the capacitors CA0' and CA0 to CA4 during the sampling process is expressed by the following equation (1).

$$Q = -32C(VINA - VTL) \quad (1)$$

After the sampling is completed, the successive approximation A/D converter performs successive approximation to determine the value for each bit in sequence, starting with the MSB of the digital data and working toward the LSB thereof.

The successive approximation control circuit SAR in FIG. 5 turns off (opens) the switch SCA in FIG. 5 so that the potential of the node TOPA is determined by redistributing the charge stored in the capacitors CA0' and CA0 to CA4 during the above sampling process among the capacitors CA0' and CA0 to CA4. In the following description, redistributing the charge stored in the capacitors CA0' and CA0 to CA4 among the capacitors CA0' and CA0 to CA4 will be referred to as the "charge redistribution." Further, the successive approximation control circuit SAR controls the switches SMA0' and SMA0 to SMA4 by the control signal so that the bottom plate of the capacitor CA0' is connected to ground (GND). Furthermore, the successive approximation control circuit SAR appropriately controls the switches SMA0' and SMA0 to SMA4 by the control signal so that the bottom plates of the capacitors CA0 to CA4 are selectively connected to the power supply Vref or GND.

The potential of VSUB is determined by controlling the switches SS0 to SS31 in the resistive sub DAC.

The process for determining the values of the high-order five bits will now be described. The A/D converter of FIG. 5 operates in such a manner that first the values of the high-order five bits are determined by the capacitive DAC and then the values of the low-order five bits are determined by the resistive DAC, to obtain a total of 10 bits of digital data. During the process for determining the high-order five bits, VSUB is held at ground potential.

Of the capacitors CA0' and CA0 to CA4, the capacitors whose bottom plates are connected to the power supply Vref (the reference potential Vref is applied to the bottom plates of the capacitors selected from among CA0' and CA0 to CA4) in the successive approximation process for determining the values of the high-order five bits are assumed to have a combined capacitance value mC (m is an integer between 0 and 31, since the capacitors that can be selectively connected to the power supply Vref or ground GND are the capacitors CA0 to CA4). In this case, of the capacitors CA0' and CA0 to CA4, the capacitors whose bottom plates are connected to ground have a combined capacitance value given as (32−m)C. It will be noted here that the input capacitance of the comparator CMPA and any wiring parasitic capacitance are ignored for simplicity of explanation.

Assume that the charge Q expressed by the above equation (1) has been stored and that the potential of the node TOPA has changed to Vx as a result of charge redistribution. In this case, the charge Q stored at the top plate TOPA of the capacitors CA0' and CA0 to CA4 is expressed by the following equation (2).

$$Q = -mC(Vref - Vx) + (32 - m)C(Vx) \quad (2)$$

Since the charge expressed by this equation (2) is equal to the charge expressed by (1), the potential Vx of the node TOPA, after the charge redistribution, is determined as shown by the equation (3) below.

$$Vx = [(m/32)Vref - VINA] + VTL \quad (3)$$

As can be seen from the above equation (3), by determining whether the potential Vx of the node TOPA is higher or lower than the logic threshold voltage VTL by using the comparator CMPA, it can be determined whether the analog input signal potential Vin is higher or lower than a potential (m/32)Vref arbitrarily selected from among the potentials obtained by dividing the reference potential Vref into 32 fractions. First, VINA is compared with (½)Vref, and if VINA is greater than (½)Vref, then VINA is compared with (¾)Vref; on the other hand, if VINA is smaller than (½)Vref, then VINA is compared with (¼)Vref. By repeating this process, the values of the five-bit data can be determined bit by bit starting from the MSB.

After the high-order five-bit data has been determined by the capacitive DAC, the low-order five-bit data is determined by the resistive DAC. The process for determining the low-order five-bit data by the resistive DAC will be described below.

The potential of the bottom plate VSUB of the capacitor CA0' whose capacitance is (1/32)C compared with the combined capacitance 32C of the capacitors CA0' and CA0 to CA4 is varied in increments of Vref/32 by using the five-bit resistive DAC. In this manner, the potential of TOPA can be varied in increments of Vref/1024.

For example, of the capacitors CA0 to CA4, the capacitors whose bottom plates are connected to the power supply Vref (the reference potential Vref is applied to the bottom plates of the capacitors selected from among CA0 to CA4) are assumed to have a combined capacitance value mC (m is an integer between 0 and 31). In this case, of the capacitors CA0 to CA4, the capacitors whose bottom plates are connected to ground have a combined capacitance value given as (31−m)C. Further, the potential of the bottom plate of CA0' is assumed to be nVref/32 (n is an integer between 0 and 31). It will be noted here that the input capacitance of the comparator CMPA and any wiring parasitic capacitance are ignored for simplicity of explanation.

The potential of TOPA that is determined by charge redistribution is obtained in the following way. Assume that the charge Q expressed by the above equation (1) has been stored and that the potential of the node TOPA has changed to Vx as a result of charge redistribution. In this case, the charge Q stored at the top plate of the capacitors CA0' and CA0 to CA4 is expressed by the following equation (4).

$$Q = -mC(Vref - Vx) + (31 - m)C(Vx) - C(nVref/32 - Vx) \quad (4)$$

Since the charge expressed by this equation (4) is equal to the charge expressed by (1), the potential Vx of the node TOPA, after the charge redistribution, is determined as shown by the equations (5) and (6) below.

$$Vx = [(m/32)Vref + (n/1024)Vref - Vin] + VTL \qquad (5)$$

$$Vx = ((32m/1024)Vref + (n/1024)Vref - VINA) + VTL \qquad (6)$$

As can be seen from the above equations (5) and (6), by determining whether the potential Vx of the node TOPA is higher or lower than the logic threshold voltage VTL by using the comparator, it can be determined whether the analog input signal potential VINA is higher or lower than a potential ((32m+n)/1024)Vref arbitrarily selected from among the potentials obtained by dividing the reference potential Vref into 1024 fractions. By successively narrowing the VINA value range to ½ by a binary search as in the process for determining the high-order five bits using the capacitive DAC, the values of the low-order five-bit data can be determined bit by bit starting from the MSB. The process for converting the analog signal into a digital value can be accomplished based on the above-described principle.

While the above describes the A/D conversion of the channel A analog input signal, the conversion process is the same for the other channels B and C. The conversion of the channel B analog input signal is performed using the capacitive MDACB, the comparator CMPB, and the resistive sub DAC SDAC. The conversion of the channel C analog input signal is performed using the capacitive MDACC, the comparator CMPC, and the resistive sub DAC SDAC.

The successive approximation A/D converter of the first embodiment accomplishes the three-channel simultaneous sampling A/D conversion function in the following manner.

First, the switches SMA0', SMA0, SMA1, . . . , SMA4, switches SMB0', SMB0, SMB1, . . . , SMB4, and switches SMC0', SMC0, SMC1, . . . , SMC4 in the three respective main DACs are connected to VINA, VINB, and VINC, respectively. At the same time, SCA, SCB, and SCC are all closed. As a result, VINA is applied to the bottom plates of CA0', CA0, CA1, . . . , CA4, VINB is applied to the bottom plates of CB0', CB0, CB1, . . . , and CB4, and VINC is applied to the bottom plates of CC0', CC0, CC1, . . . , CC4, while TOPA, TOPB, and TOPC are brought to a potential approximately equal to one half of the supply voltage.

Next, when the switches SCA, SCB, and SCC are simultaneously opened, the charges stored in the respective capacitor arrays cannot escape and thus remain held in the respective capacitor arrays. Since SCA, SCB, and SCC are simultaneously opened, the signal values of VINA, VINB, and VINC at the same time instant are captured, thus accomplishing the simultaneous sampling.

After the simultaneous sampling is completed, the selector SEL is set to select CMPA so that the output of CMPA is delivered to SARP1. The output of CMPA is thus delivered to SARP1, and successive approximation conversion is performed by controlling SMA0', SMA0, SMA1, . . . , SMA4 and SS0, SS1, . . . , SS31 from SARP1. It is understood that the circuit is configured so that the switches SMB0', SMB0, SMB1, . . . , SMB4 and the switches SMC0', SMC0, SMC1, . . . , SMC4 are maintained in the hold state during that time. The successive approximation control circuit SARP1 implements these unique control functions. The successive approximation conversion is performed by using the previously described binary search technique. When the successive approximation conversion is completed, VINA converted into digital form is obtained, and the resulting digital signal is output as D0.

After the successive approximation conversion of VINA is completed, the selector SEL is set to select CMPB so that the output of CMPB is delivered to SARP1. The output of CMPB is thus delivered to SARP1, and successive approximation conversion is performed by controlling SMB0', SMB0, SMB1, . . . , SMB4 and SS0, SS1, . . . , SS31 from SARP1. It is understood that the circuit is configured so that the switches SMC0', SMC0, SMC1, . . . , SMC4 are maintained in the hold state during that time. The conversion process is the same as that for the successive approximation A/D conversion of VINA described above, and the details of the process will not be further described herein. When the successive approximation conversion is completed, VINB converted into digital form is obtained, and the resulting digital signal is output as D0.

After the successive approximation conversion of VINB is completed, SEL is set to select CMPC so that the output of CMPC is delivered to SARP1. The output of CMPC is thus delivered to SARP1, and successive approximation conversion is performed by controlling SMC0', SMC0, SMC1, . . . , SMC4 and SS0, SS1, . . . , SS31 from SARP1. The conversion process is the same as that for the successive approximation A/D conversion described above, and the details of the process will not be further described herein. When the successive approximation conversion is completed, VINC converted into digital form is obtained, and the resulting digital signal is output as DO.

The three-channel simultaneous sampling function can be accomplished by the above sequence of operations.

Figure 6:
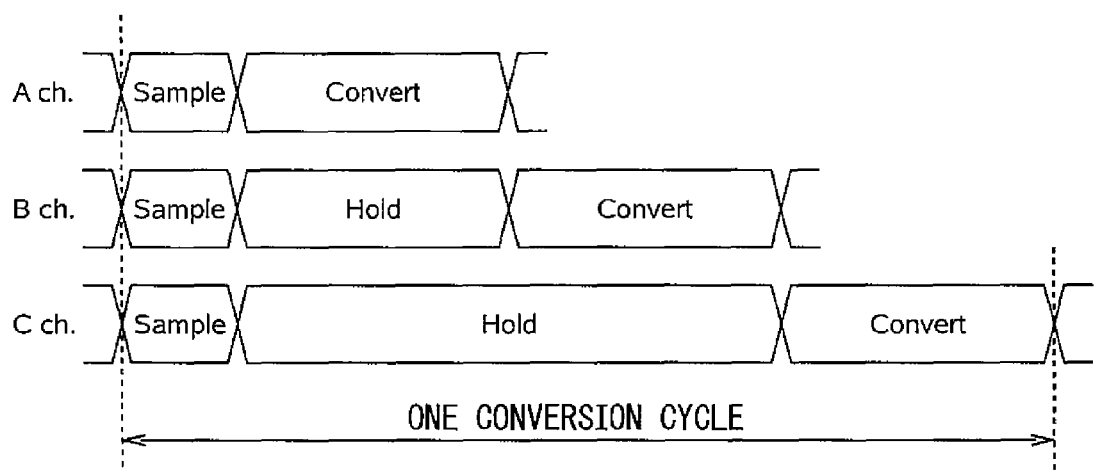
FIG. 6 is a time chart showing the A/D conversion timing employed in the successive approximation A/D converter of the first embodiment.

FIG. 6 is a diagram for explaining in what sequence the sampling and the successive approximation conversion are performed in the first embodiment. In FIG. 6, Sample indicates the sampling period, Hold indicates the period during which the sampled charge is held, and Convert indicates the period during which the successive approximation conversion is performed. In FIG. 6, the abscissa represents the time.

In the first embodiment, after the three channels A, B, and C have been sampled simultaneously, the successive approximation conversion of the channel A is performed. During that time, the channels B and C are maintained in the hold state. After the successive approximation conversion of the channel A is completed, the successive approximation conversion of the channel B is performed. During that time, the channel C is maintained in the hold state, but the channel A for which the digital conversion is already completed need not be maintained in the hold state. After the successive approximation conversion of the channel B is completed, the successive approximation conversion of the channel C is performed. During that time, the channels A and B for which the digital conversion is already completed need not be maintained in the hold state. In other words, in the first embodiment, the successive approximation conversion is performed three times, one for each channel.

Figure 2:
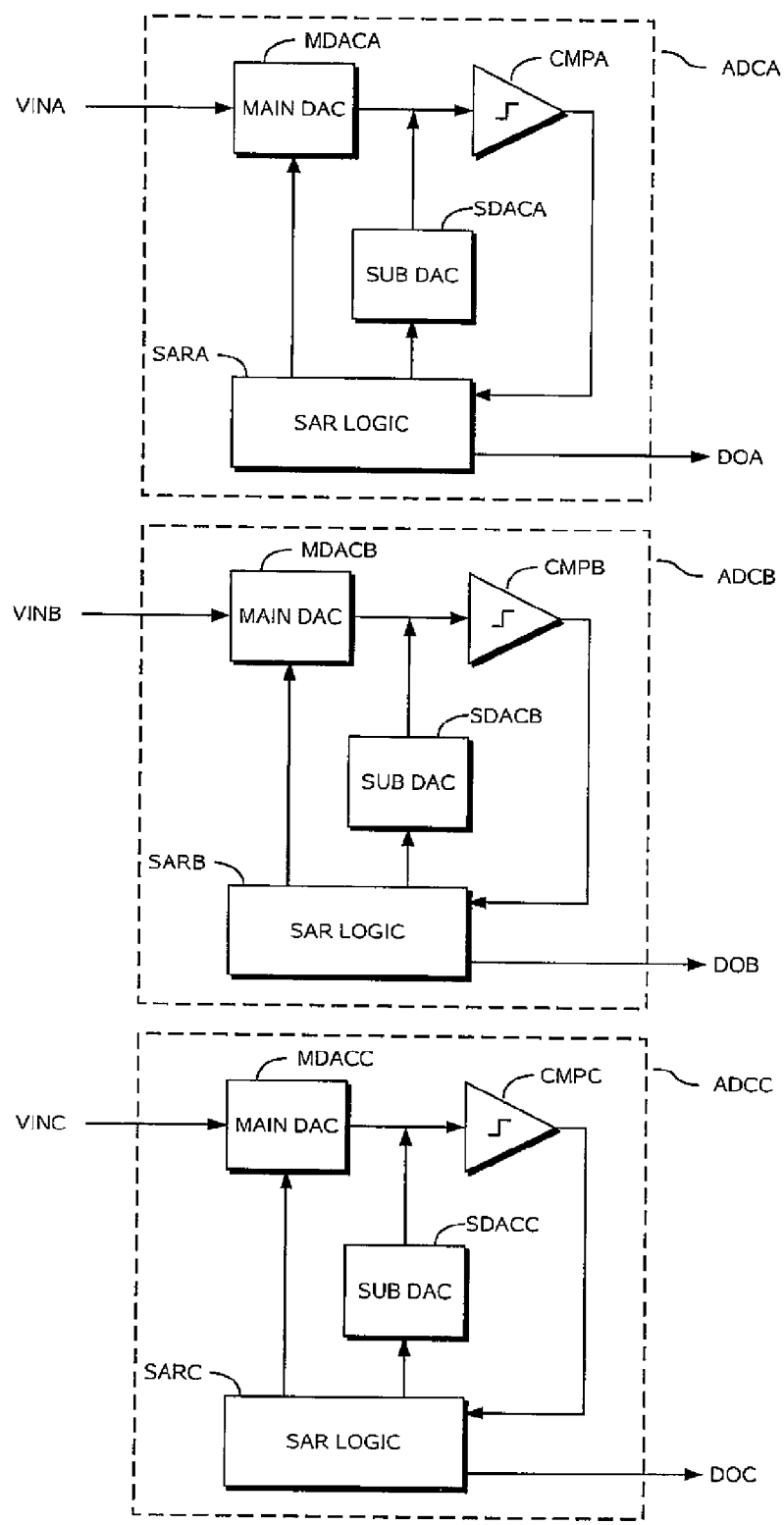
FIG. 2 is a diagram showing a circuit example of a prior art successive approximation A/D converter for performing simultaneous sampling.

While the three-channel simultaneous sampling successive approximation A/D converter of the prior art shown in FIG. 2 requires the provision of three resistive DACs and three successive approximation control circuits, the successive approximation A/D converter of the first embodiment requires only one resistive DAC and only one successive approximation control circuit, so that the circuit area can be reduced while also reducing the current consumption.

Figure 3:
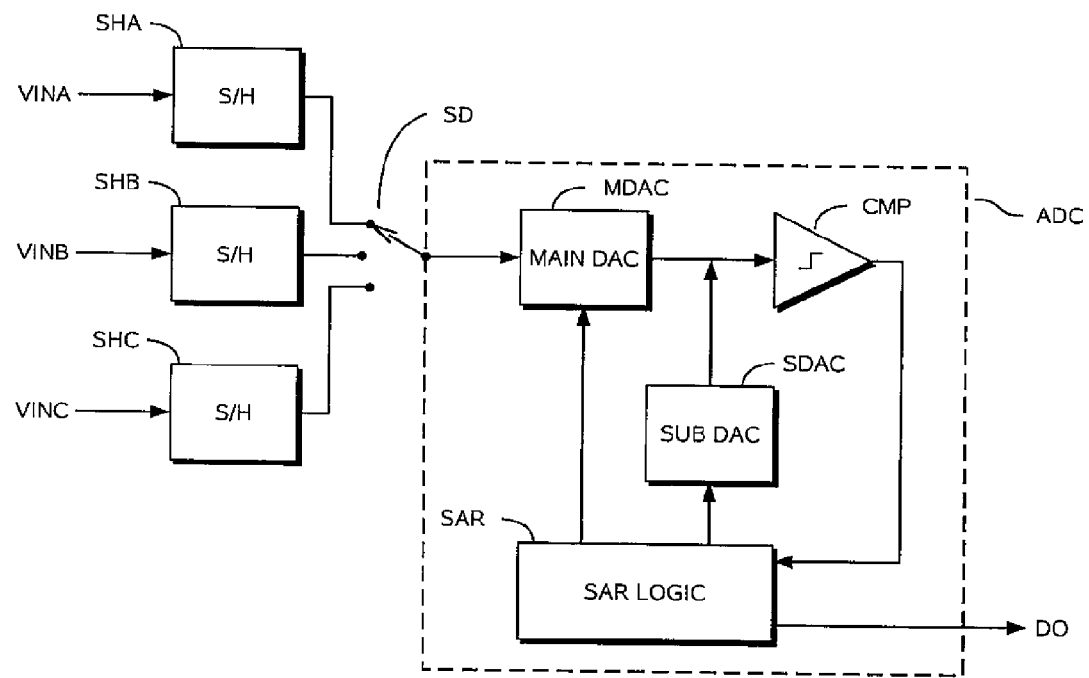
FIG. 3 is a diagram showing another circuit example of a prior art successive approximation A/D converter for performing simultaneous sampling.

On the other hand, the three-channel simultaneous sampling successive approximation A/D converter of the prior art shown in FIG. 3 requires the provision of three sample-and-hold circuits and one A/D converter. The A/D converter includes a capacitive main DAC which requires a relatively large chip area, and each sample-and-hold circuit requires the use of a capacitive element which takes up approximately the same area as the capacitive main DAC. In other words, the prior art circuit requires an area equivalent to about four capacitive elements. By contrast, in the first embodiment, since three capacitive main DACs need be provided, the circuit area can be reduced compared with the circuit of FIG. 3. Furthermore, the sample-and-hold circuits used in the circuit of FIG. 3 each require the use of an amplifier which consumes a steady-state current. The first embodiment can reduce the current consumption by eliminating the need for such an amplifier. Further, the prior art has had the problem that since it is difficult for the amplifier to handle signals near the power rails, the sample-and-hold circuit cannot sample input signals near the power rails and, as a result, the input signals near the power rails cannot be A/D converted. However, this problem does not occur in the first embodiment, which does not require the use of a sample-and-hold circuit.

In the three-channel simultaneous sampling successive approximation A/D converter of the prior art shown in FIG. 2, because of the provision of three independent A/D converters, both the sampling processes and the successive approximation conversion processes can be performed concurrently for the three channels, or separately at different times if desired. In the first embodiment, since SCA, SCB, and SCC can be controlled independently of each other, the sampling processes can be performed concurrently, or separately at different times if desired. However, the successive approximation conversion processes cannot be performed concurrently, because the circuit of the first embodiment is provided with only one resistive sub DAC and only one successive approximation control circuit.

Compared with the three-channel simultaneous sampling successive approximation A/D converter of the prior art shown in FIG. 2, the successive approximation A/D converter of the first embodiment has the shortcoming that the successive approximation conversion processes cannot be performed concurrently, but the circuit area and current consumption can be reduced. This offers the advantage of being able to reduce the cost (the circuit area) in applications where the inability to perform the successive approximation conversion processes concurrently does not present any problem.

The successive approximation A/D converter of the prior art shown in FIG. 3 is provided with three sample-and-hold circuits and one A/D converter. In the circuit of FIG. 3, since the three sample-and-hold circuits can be controlled independently of each other, the sampling processes can be performed concurrently, or separately at different times if desired. However, the successive approximation conversion processes cannot be performed concurrently, because the circuit of FIG. 3 is provided with only one A/D converter.

The successive approximation A/D converter of the first embodiment and the successive approximation A/D converter of FIG. 3 share the disadvantage that the successive approximation conversion processes cannot be performed concurrently, and the circuit of FIG. 3 can be replaced by the circuit of the first embodiment shown in FIG. 4 without losing any function. Compared with the prior art circuit of FIG. 3, the circuit of the first embodiment shown in FIG. 4 has the advantage that the number of capacitive elements can be reduced, which serves to reduce the circuit area.

Figure 7:
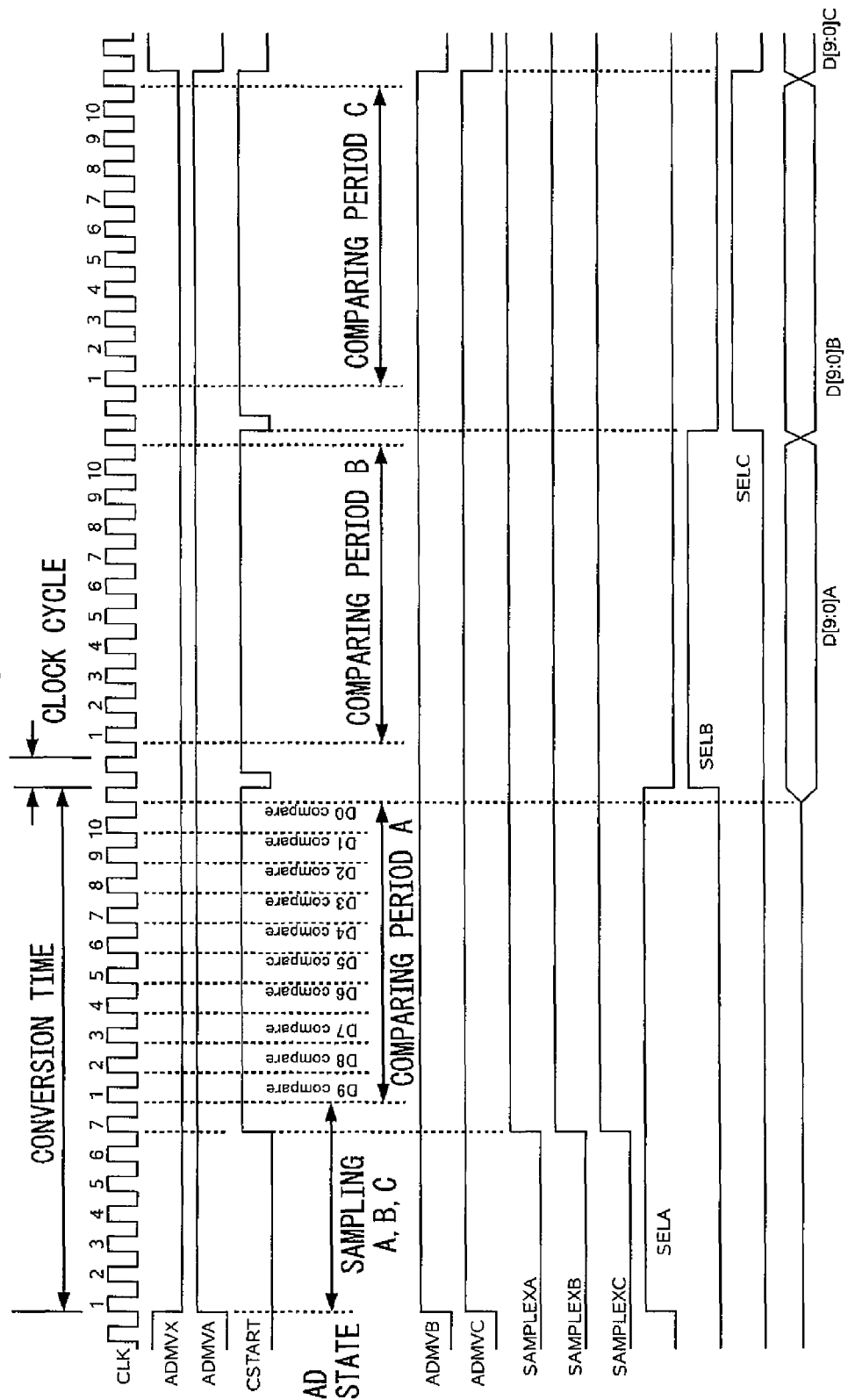
FIG. 7 is a time chart showing in further detail the A/D conversion timing employed in the successive approximation A/D converter of the first embodiment.

FIG. 7 is a timing diagram showing in further detail the control signals and internal state transitions when performing the three-channel simultaneous sampling A/D conversion using the successive approximation A/D converter of the first embodiment.

In FIG. 7, SAMPLING A, B, C indicates the simultaneous sampling period of the channels A, B, and C, and COMPARE PERIODS A, B, and C indicate the successive approximation conversion periods of the respective channels A, B, and C.

The three-channel simultaneous sampling A/D conversion process will be described with reference to FIGS. 4 and 7.

It is to be understood that, at the start time of the waveform of FIG. 7, the A/D conversion circuit is in its initial state. In the initial state, ADMVX="H" (which means that the A/D converter is inoperative, and the resistive sub DAC is in the power-down state), ADMVA=ADMVB=ADMVC="L" (which means that the A/D conversions of the channels A, B, and C are not performed, and the comparators CMPA to CMPC are in the power-down state), CSTART="L" (which means that the successive approximation conversion is not performed, and the successive approximation control circuit SARP1 is in its initial state), SAMPLEXA=SAMPLEXB=SAMPLEXC="L" (which means that the channels A, B, and C are set to the sampling state), and SELA=SELB=SELC="L" (which means that SEL selects none of CMPAO, CMPBO, and CMPAO). In other words, in the initial state of the waveform of FIG. 7, the A/D converter is in an idle state.

When starting the A/D conversion, ADMVX is set to "L" to operate the A/D converter (i.e. to operate the resistive sub DAC), ADMVA, ADMVB, and ADMVC are set to "H" to direct the initiation of the A/D conversion for the channels A, B, and C (i.e. to operate the comparators CMPA to CMPC), and SELA is set to "H", thereby setting SEL to the state that selects CMPAO. As ADMVA, ADMVB, and ADMVC rise, CMPA, CMPB, and CMPC start sampling. In the initial state, the sampling control signals SAMPLEXA, SAMPLEXB, and SAMPLEXC are "L", but the comparators are in the power-down state; therefore, the actual sampling operation starts when ADMVA, ADMVB, and ADMVC are set to "H". When the sampling is started, MDACA, MDACB, and MDACC are charged to potentials proportional to VINA, VINB, and VINC, respectively.

After sufficient sampling has been performed, SAMPLEXA, SAMPLEXB, and SAMPLEXC are set to "H" so as to end the sampling operation. In a circuit example that will be described later, after the sampling end signals SAMPLEXA, SAMPLEXB, and SAMPLEXC have been set to "H", the sampling continues for one cycle period of the clock CLK; therefore, in FIG. 7 also, the period continuing up to the end of the one cycle period after SAMPLEXA, SAMPLEXB, and SAMPLEXC have been set to "H" is shown as the sampling period. The control of the sampling period shown in FIG. 7 is only one example, and it will be appreciated that the period continuing up to the end of the one cycle period after SAMPLEXA, SAMPLEXB, and SAMPLEXC have been set to "H" need not necessarily be set as the sampling period, but that the sampling period can be modified or changed in various ways.

At the same time that the sampling end signals SAMPLEXA, SAMPLEXB, and SAMPLEXC are set to "H", the successive approximation conversion start signal CSTART is set to "H".

As in an example to be described later, the example shown here assumes the circuit in which by setting CSTART to "L", the counter in the successive approximation control circuit is initialized and, by setting CSTART to "H", the successive approximation operation by the comparator is started after waiting for one cycle period of the clock CLK to elapse from the time that CSTART is set to "H". The control and timing of the CSTART signal shown in FIG. 7 is only one example, and the configuration of the control circuit and the relationship between the clock and control signals can be designed suitably without departing from the spirit and scope of the present embodiment.

SEL is set to the state that selects CMPAO when the A/D conversion is started. This corresponds to the state in the seventh cycle of the CLK signal in FIG. 7. Since SAMPLEXA, SAMPLEXB, and SAMPLEXC are set to "H", the charges stored in MDACA, MDACB, and MDACC remain held therein. When CSTART is set to "H", SARP1 starts the successive approximation conversion by controlling SDAC and MDACA.

When the successive approximation conversion is started, D9 (most significant bit) is compared in the next cycle of CLK to determine whether the value of D9 is "1" or "0". In the clock cycle that follows, D8 (second significant bit) is compared to determine whether the value of D8 is "1" or "0". Thereafter, the values are sequentially determined in decreasing order of significance until D0 (least significant bit) is reached. This process corresponds to the "COMPARE PERIOD A" in FIG. 7. A 10-bit digital code is thus determined over a total of 10 cycles, and is output as DO.

Next, SELA is set to "L", and SELB is set to "H", thereby setting SEL to the state that selects CMPBO. At the same time, CSTART is momentarily set to "L" and then set back to "H" to start the successive approximation conversion of the channel B. As a result, the successive approximation conversion of the channel B starts from the next cycle of CLK; this process corresponds to the "COMPARE PERIOD B" in FIG. 7. The successive approximation of the channel B is performed over a total of 10 clock cycles, and a 10-bit digital code thus determined is output as DO.

Next, SELB is set to "L", and SELC is set to "H" thereby setting SEL to the state that selects CMPCO. At the same time, CSTART is momentarily set to "L" and then set back to "H" to start the successive approximation conversion of the channel C. As a result, the successive approximation conversion of the channel C starts from the next cycle of CLK; this process corresponds to the "COMPARE PERIOD C" in FIG. 7. The successive approximation of the channel C is performed over a total of 10 clock cycles, and a 10-bit digital code thus determined is output as DO.

Figure 8:
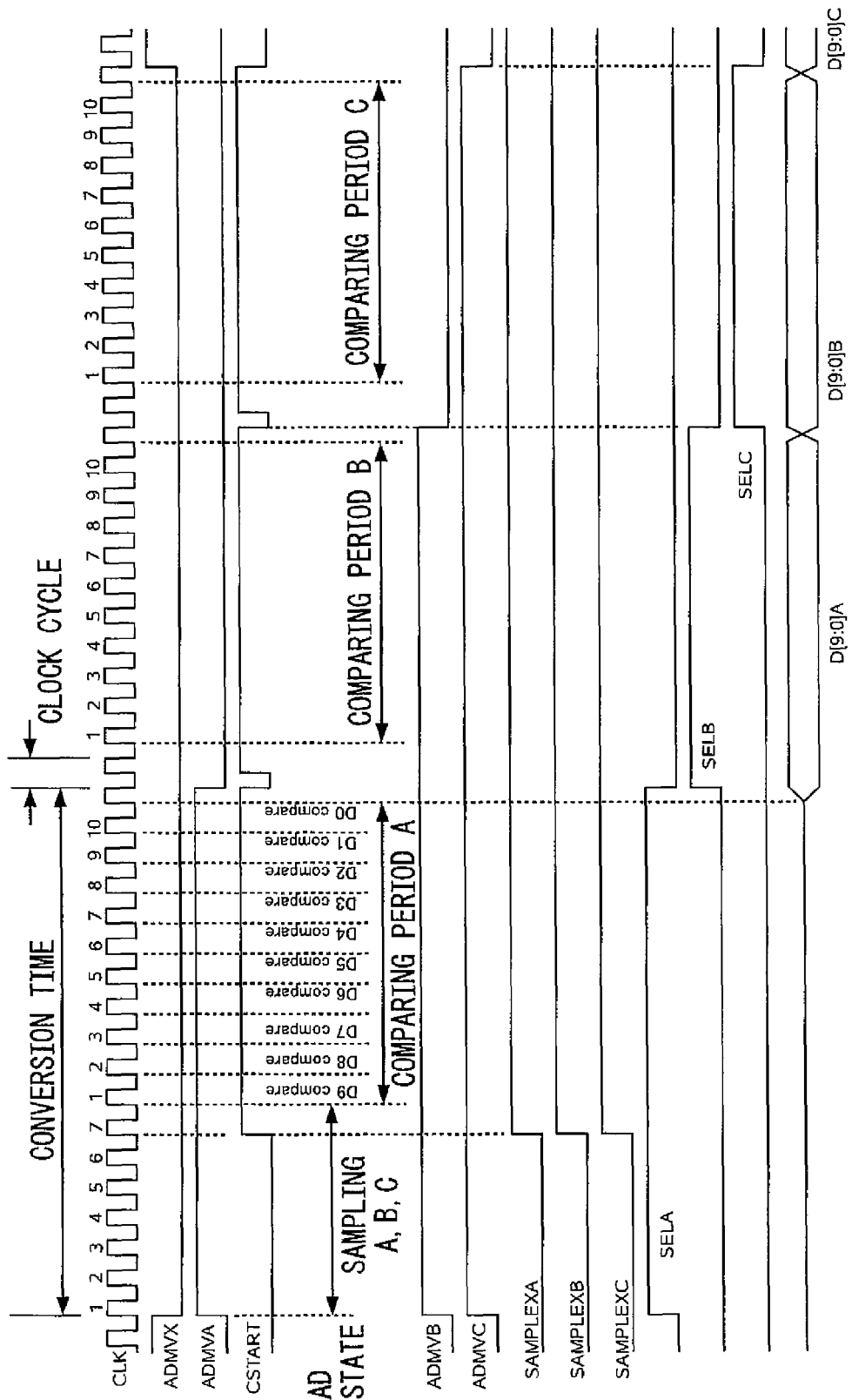
FIG. 8 is a time chart showing in further detail the A/D conversion timing employed in the successive approximation A/D converter of the first embodiment.

FIG. 8 shows another example of the control signals and internal state transitions when performing the three-channel simultaneous sampling A/D conversion using the successive approximation A/D converter of the first embodiment shown in FIG. 4.

In the conversion process shown in FIG. 7, ADMVA, ADMVB, and ADMVC are all held in the "H" state throughout the A/D conversion process. In FIG. 8, on the other hand, ADMVA is set to "L" after the end of the "COMPARE PERIOD A." In other words, since there is no need to hold the analog signal of the channel A once the A/D conversion of the channel A is completed, ADMVA may be set to "L" to discard the analog signal. When the ADMVA is set to "L", CMPA is put in the power-down state, and the charge stored by sampling VINA is lost. Here, if the circuit is designed so that when ADMVA is set to "L", power is turned off to the circuit responsible for the A/D conversion of the channel A, and the current consumption can be reduced. ADMVB can also be set to "L" at the end of the "COMPARE PERIOD B" for the same reason as ADMVA. The timing diagram of FIG. 8 showing the control signals and internal state transitions is the same as that of FIG. 7, except that ADMVA and ADMVB are controlled as described above.

Figure 9:
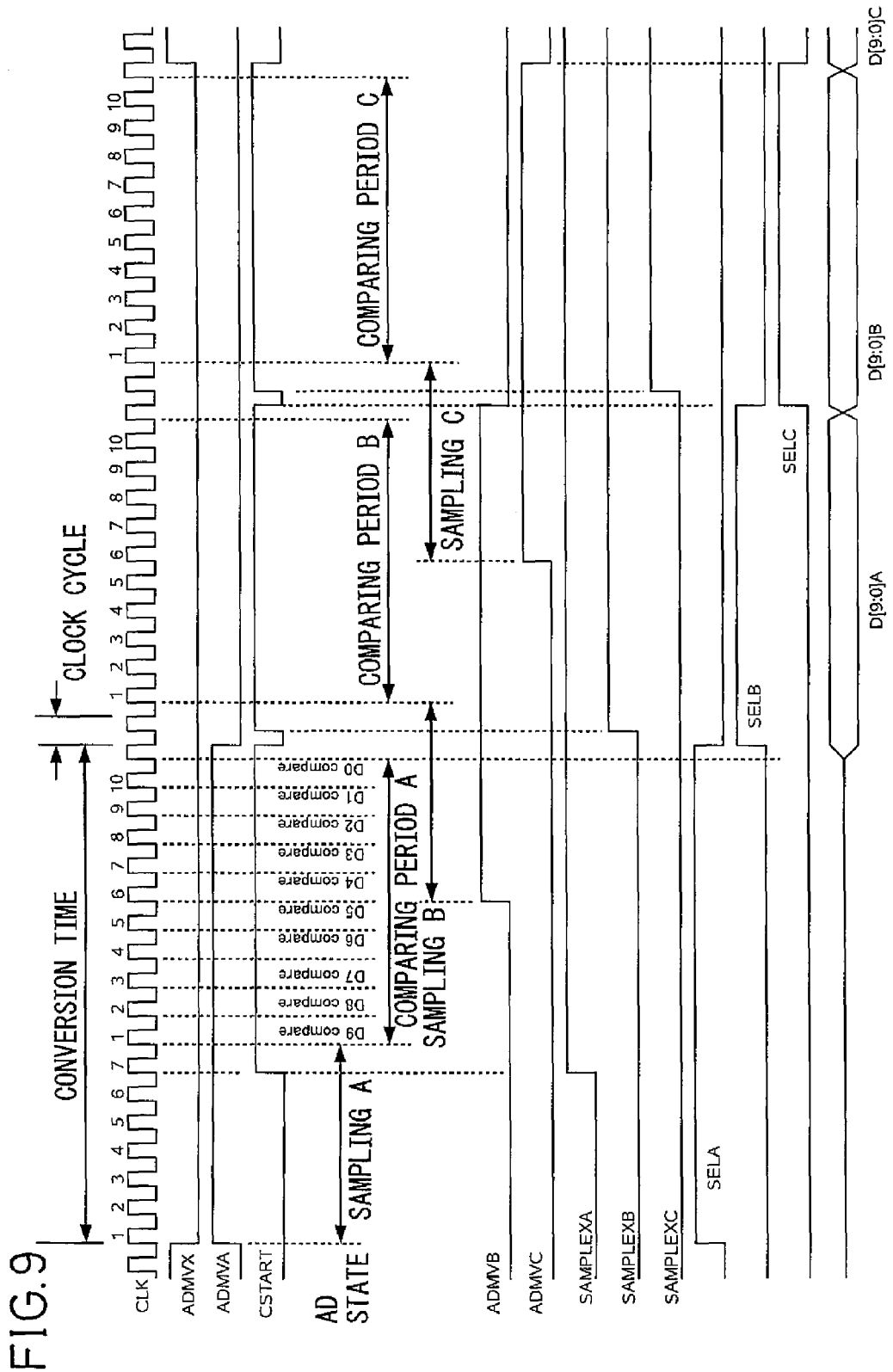
FIG. 9 is a time chart showing in further detail the A/D conversion timing employed in the successive approximation A/D converter of the first embodiment.

FIG. 9 is a timing diagram showing the control signals and internal state transitions for the case where sampling is performed sequentially, one channel at a time, and successive approximation conversion is performed sequentially, one channel at a time, using the successive approximation A/D converter of the first embodiment shown in FIG. 4.

In FIG. 9, SAMPLING A indicates the channel A sampling period, SAMPLING B indicates the channel B sampling period, and SAMPLING C indicates the channel C sampling period.

The process for sampling the channels A, B, and C sequentially, one channel at a time, and performing the successive approximation conversion sequentially, one channel at a time, will be described below.

In the initial state, ADMVX="H" (which means that the A/D converter is inoperative, and the resistive DAC is in the power-down state), ADMVA=ADMVB=ADMVC="L" (which means that the A/D conversions of the channels A to C are not performed, and the comparators CMPA to CMPC are inoperative), CSTART="L" (which means that the successive approximation conversion is not performed), SAMPLEXA=SAMPLEXB=SAMPLEXC="L" (which means that the channels A to C are set to the sampling state), and SELA=SELB=SELC="L" (which means that SEL selects none of CMPAO, CMPBO, and CMPCO). Thus, in the initial state of the waveform of FIG. 9, the A/D converter is in an idle state.

When starting the A/D conversion, ADMVX is set to "L" to operate the A/D converter (i.e. to operate the resistive sub DAC). At the same time, ADMVA is set to "H" to direct the initiation of the A/D conversion for the channel A, and SELA is set to "H" thereby setting SEL to the state that selects CMPAO. As ADMVA rises, CMPA starts sampling, and a charge proportional to VINA is stored in MDACA.

After sufficient sampling has been performed, SAMPLEXA is set to "H" to end the sampling operation. At the same time, the successive approximation conversion start signal CSTART is set to "H". SEL is set to the state that selects CMPAO when the A/D conversion is started. This corresponds to the state in the seventh cycle of the CLK signal in FIG. 9. When CSTART is set to "H", SARP1 starts the successive approximation conversion by controlling SDAC and MDACA.

When the successive approximation conversion is started, D9 (most significant bit) is compared in the next cycle of CLK to determine whether the value of D9 is "1" or "0". In the clock cycle that follows, D8 (second significant bit) is compared to determine whether the value of D8 is "1" or "0". Thereafter, the values are sequentially determined in decreasing order of significance until D0 (least significant bit) is reached. This process corresponds to the "COMPARE PERIOD A" in FIG. 9. A 10-bit digital code is thus determined over a total of 10 cycles, and is output as DO.

In the "COMPARE PERIOD A," the successive approximation conversion of the channel A is performed, but partway through that period, ADMVB is set to "H" to direct the initiation of the A/D conversion for the channel B. As ADMVB rises, CMPB starts sampling, and a charge proportional to VINB is stored in MDACB.

After the successive approximation conversion of the channel A is completed, SAMPLEXB is set to "H" to end the sampling of the channel B, and SELA is set to "L" while, at the same time, setting SELB to "H", thereby setting SEL to the state that selects CMPBO. At the same time, CSTART is caused to fall momentarily and then caused to rise again in order to start the successive approximation conversion of the channel B. When CSTART is thus set back to "H", SARP1 starts the successive approximation conversion by controlling SDAC and MDACB.

When the successive approximation conversion is started, D9 (most significant bit) is compared in the next cycle of CLK to determine whether the value of D9 is "1" or "0". In the clock cycle that follows, D8 (second significant bit) is compared to determine whether the value of D8 is "1" or "0". Thereafter, the values are sequentially determined in decreasing order of significance until D0 (least significant bit) is reached. This process corresponds to the "COMPARE PERIOD B" in FIG. 9. A 10-bit digital code is thus determined over a total of 10 cycles, and is output as DO.

In the "COMPARE PERIOD B," the successive approximation conversion of the channel B is performed, but partway through that period, ADMVC is set to "H" to direct the initiation of the A/D conversion for the channel C. As ADMVC rises, CMPC starts sampling, and a charge proportional to VINC is stored in MDACC.

After the successive approximation conversion of the channel B is completed, SAMPLEXC is set to "H" to end the sampling of the channel C, and SELB is set to "L" while, at the same time, setting SELC to "H" thereby setting SEL to the state that selects CMPCO. At the same time, CSTART is caused to fall momentarily and then caused to rise again in order to start the successive approximation conversion of the channel C. When CSTART is thus set back to "H", SARP1 starts the successive approximation conversion by controlling SDAC and MDACC.

When the successive approximation conversion is started, D9 (most significant bit) is compared in the next cycle of CLK to determine whether the value of D9 is "1" or "0". In the clock cycle that follows, D8 (second significant bit) is compared to determine whether the value of D8 is "1" or "0". Thereafter, the values are sequentially determined in decreasing order of significance until D0 (least significant bit) is reached. This process corresponds to the "COMPARE PERIOD C" in FIG. 9. A 10-bit digital code is thus determined over a total of 10 cycles, and is output as DO.

As described above with reference to FIGS. 7 to 9, a variety of control modes can be achieved as needed, by providing the successive approximation control circuit controlling signal CSTART, comparator power-down signals ADMVA, ADMVB, and ADMVC, and sampling control signals SAMPLEXA, SAMPLEXB, and SAMPLEXC, independently of each other, and by performing control as shown in FIGS. 7 to 9. For example, in FIG. 7, all the comparators CMPA, CMPB, and CMPC are kept operating until the conversion is completed for all the three channels, and the three channels of analog signals are simultaneously sampled during the initial period of the conversion process, the sampled signals then being converted in sequence on a channel-by-channel basis. Since the comparators CMPA, CMPB, and CMPC are kept operating throughout the process, this has the effect of reducing variation of the power supply current and preventing the conversion accuracy from degrading due to variations in the power supply current. Furthermore, by providing the signals SELA, SELB, and SELC for selecting the channel to be subjected to the successive approximation conversion, this results in the advantage that the necessary signal can be selected for conversion at an earlier time than would otherwise be possible.

On the other hand, the control method of FIG. 8 differs from that of FIG. 7 in that the comparator dedicated to the channel for which the conversion is completed is put in the power-down state. While this gives rise to concern that conversion errors attributable to power supply resistors may increase because the power supply current gradually changes between the sampling period and the conversion period, the advantage is that comparator current can be reduced, achieving the effect of reducing the power consumption.

The control method of FIG. 9 differs from the control methods of FIGS. 7 and 8 in that the three analog signals are not sampled simultaneously. This results in the advantage of being able to set the sampling time of each analog signal as desired within a range where contention in the successive approximation control circuit is not a concern; in other words, while there is the advantage of being able to achieve simultaneous sampling, there is also flexibility in being able to sample different analog signals at different timings.

In this way, by employing the concept of the control circuit and control signals shown in FIG. 4, for example, the effect of being able to achieve a variety of control modes can be obtained. While the circuit control concept of the first embodiment has been described with reference to FIG. 4 by taking specific examples of the control signals, the same control concept can also be applied to a circuit of a third embodiment to be described later. It will also be noted that some of the control signals may be omitted, where possible. For example, if all the comparators can be kept operating throughout the process without causing any problem, ADMVA, ADMVB, and ADMVC may be replaced by a single control signal. Further, in cases where the three-channel simultaneous sampling scheme is the only choice, SAMPLEXA, SAMPLEXB, and SAMPLEXC may be replaced by a single control signal.

The control signals and the state transitions of the A/D converter when performing the A/D conversion by sampling the channels A to C in a non-simultaneous manner using the circuit of the first embodiment shown in FIG. 4 have been described above with reference to FIG. 9.

Two examples of the three-channel simultaneous sampling performed using the circuit of first embodiment shown in FIG. 4 have been described above with reference to FIGS. 7 and 8. Further, the control procedures for the various signals and the A/D conversion for the case of three-channel non-simultaneous sampling have been described above with reference to FIG. 9. Next, the circuit configurations of the various parts for implementing the successive approximation A/D converter of the first embodiment so far described will be described in further detail below.

Figure 10:
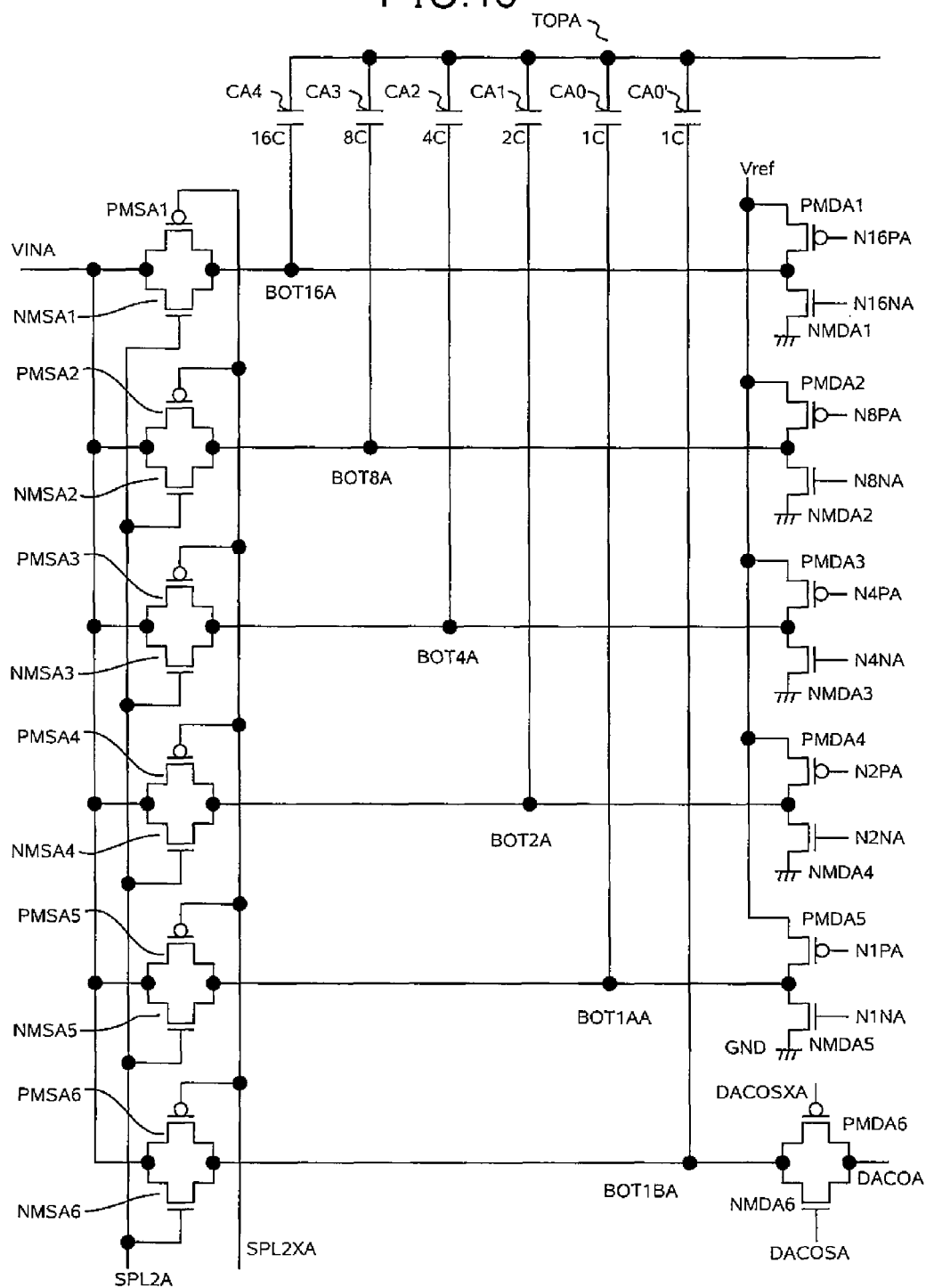
FIG. 10 is a diagram showing a circuit example of a capacitive DAC in the successive approximation A/D converter of the first embodiment.
Figure 11:
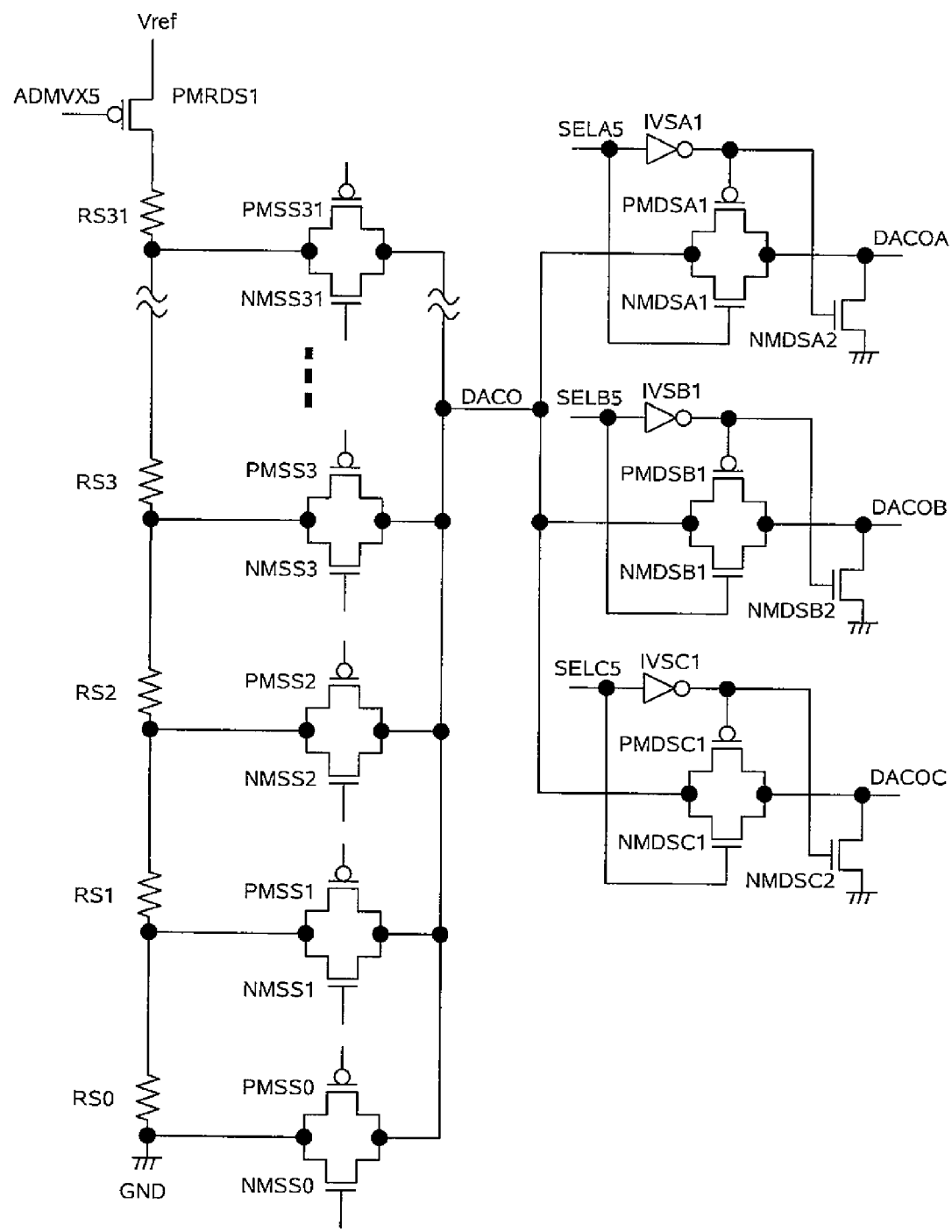
FIG. 11 is a diagram showing a circuit example of a resistive DAC in the successive approximation A/D converter of the first embodiment.
Figure 12:
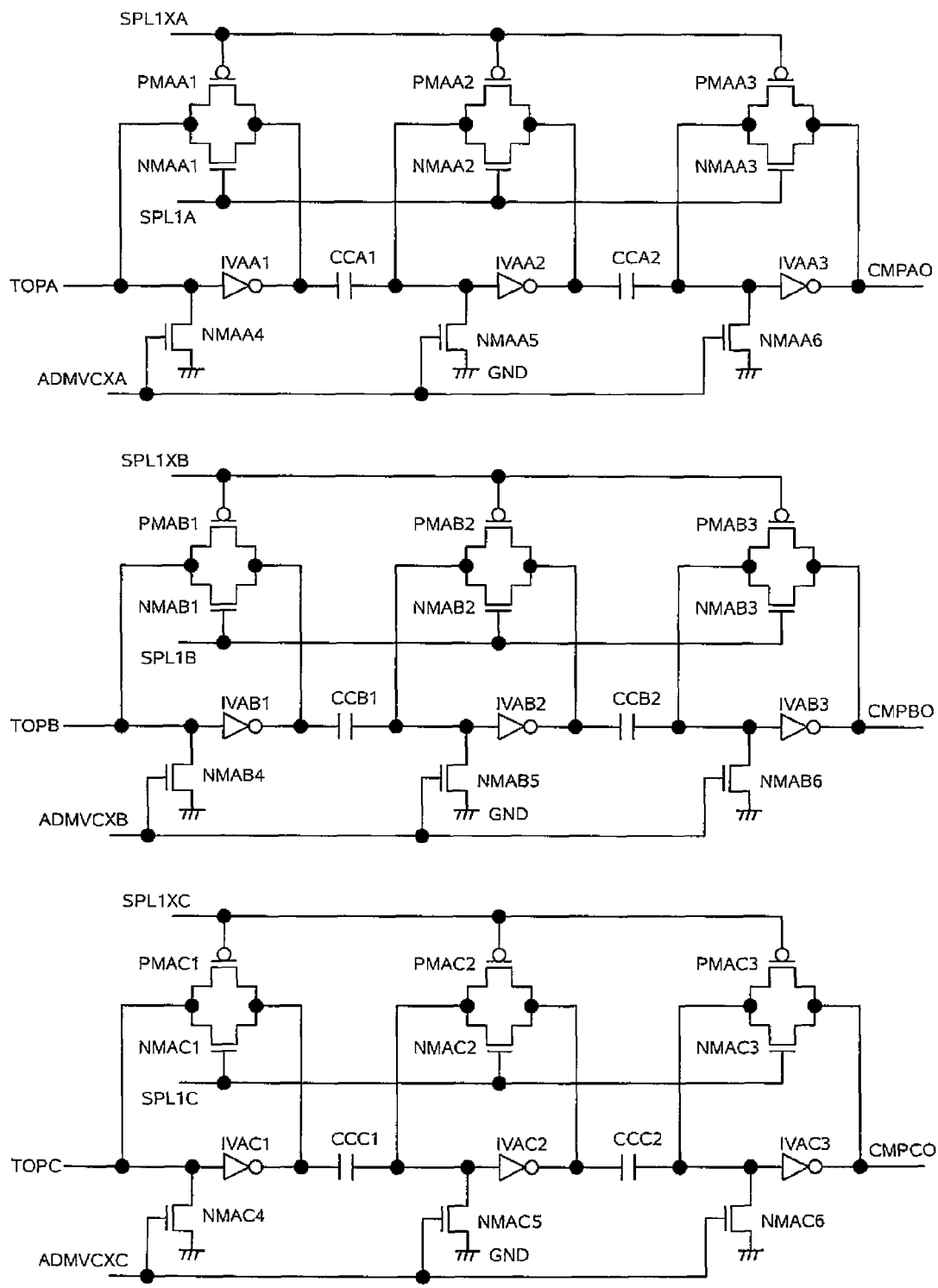
FIG. 12 is a diagram showing a circuit example of a comparator in the successive approximation A/D converter of the first embodiment.
Figure 13:
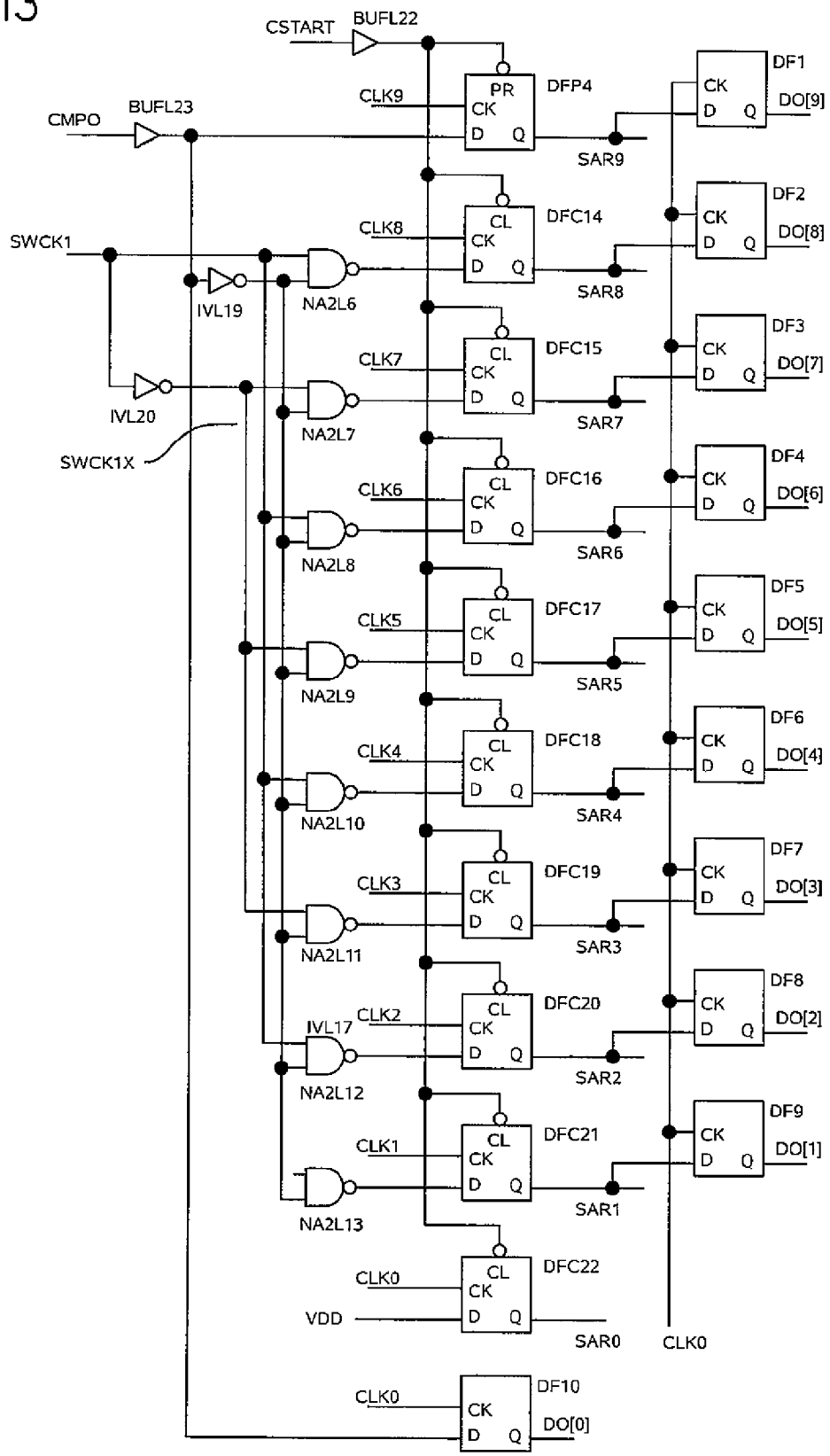
FIG. 13 is a diagram showing a circuit example of a successive approximation control circuit in the successive approximation A/D converter of the first embodiment.
Figure 14:
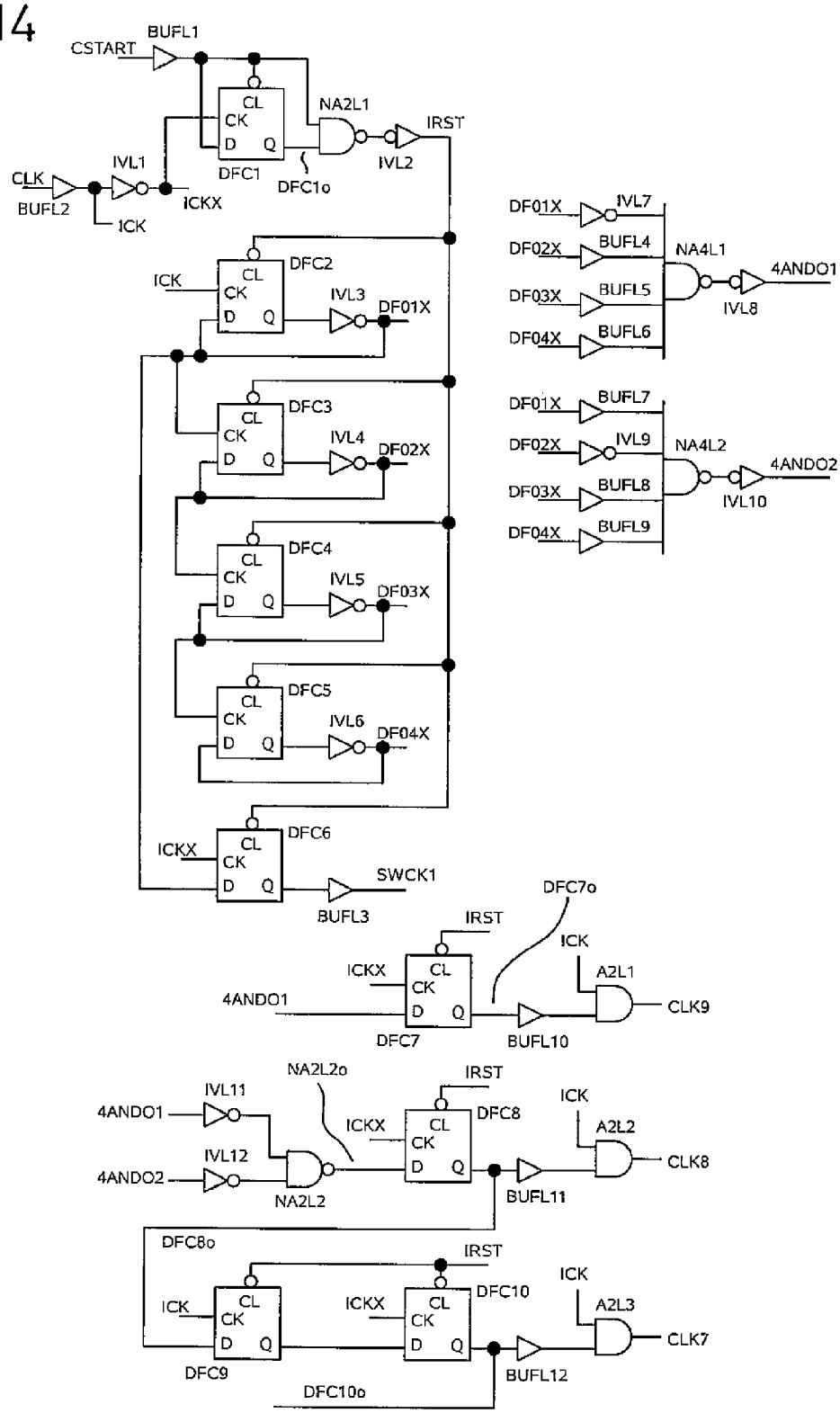
FIG. 14 is a diagram showing a circuit example of the successive approximation control circuit in the successive approximation A/D converter of the first embodiment.
Figure 15:
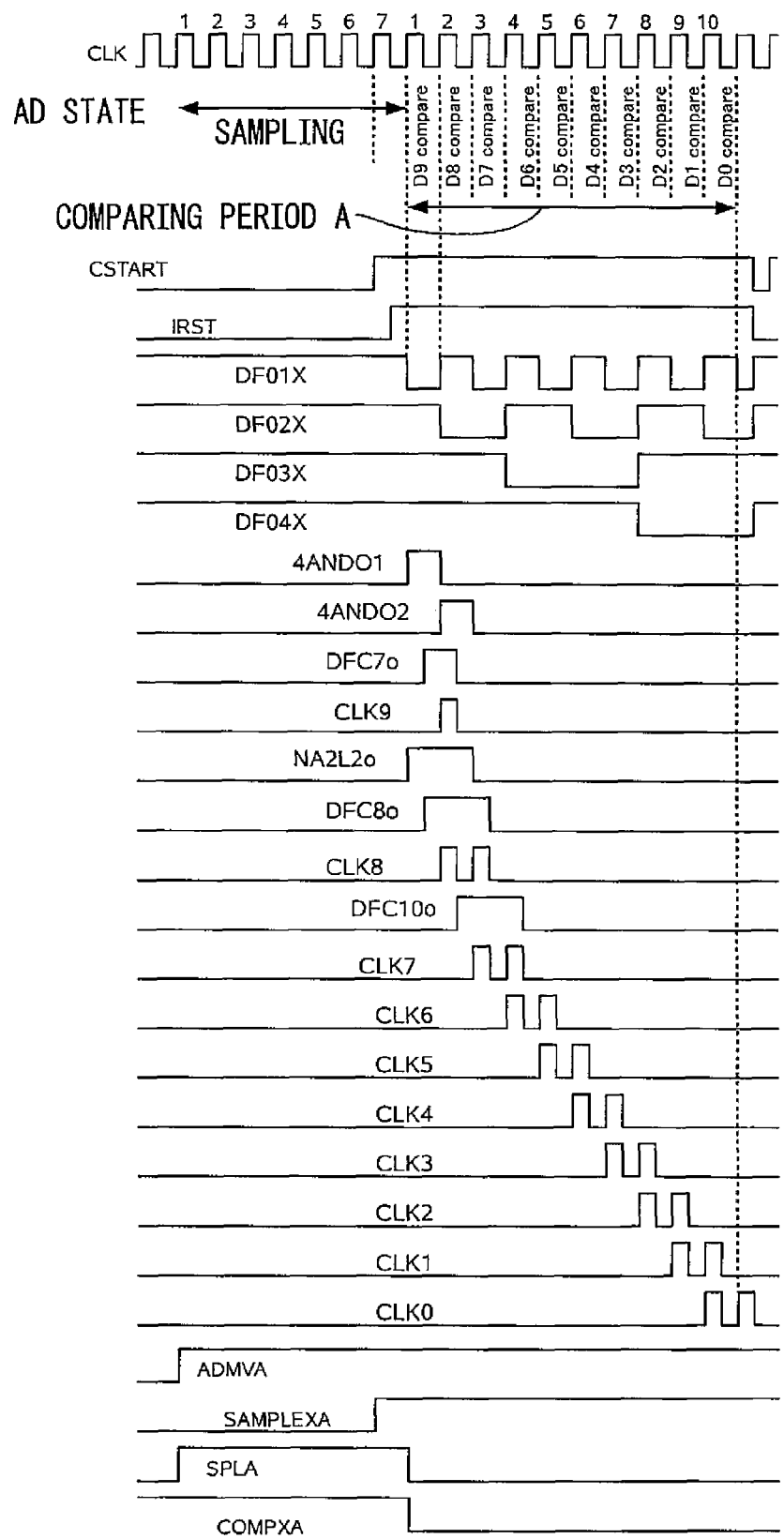
FIG. 15 is a time chart showing the operation timing of the successive approximation control circuit of FIGS. 13 and 14.
Figure 16:
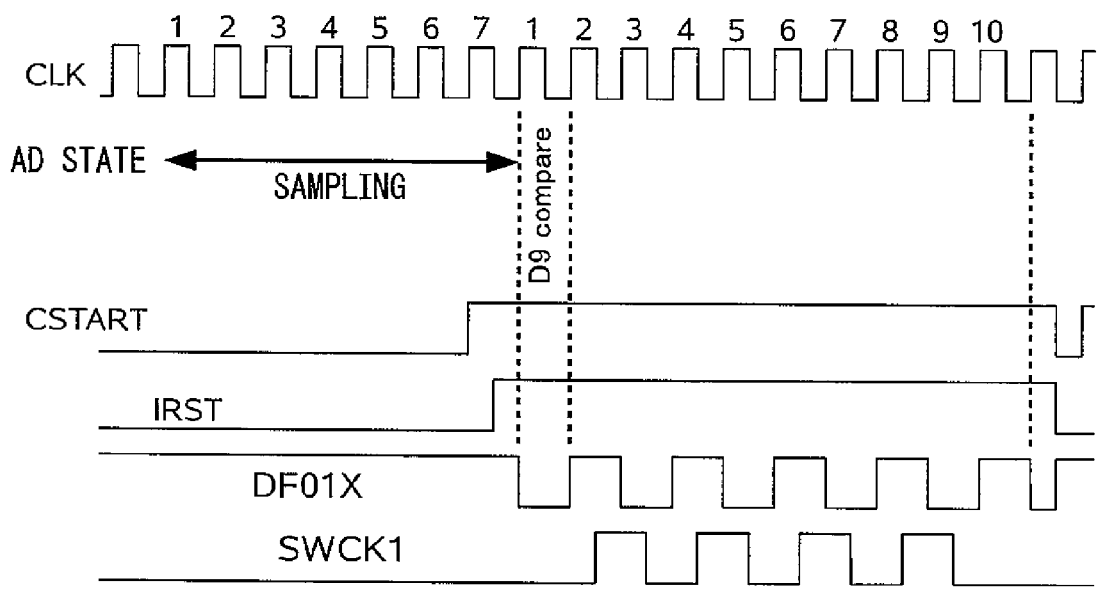
FIG. 16 is a time chart showing the operation timing of the successive approximation control circuit of FIGS. 13 and 14.
Figure 17:
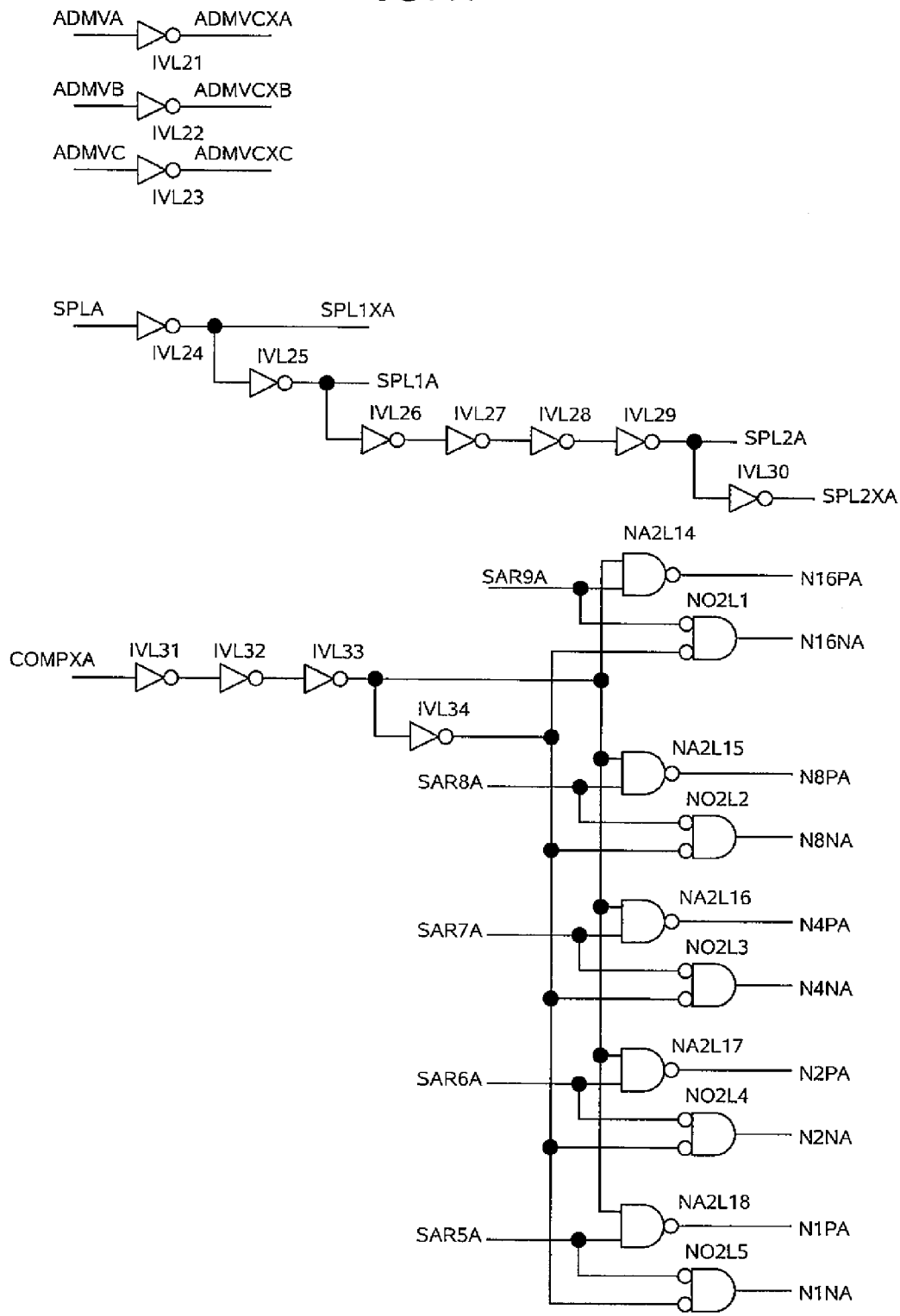
FIG. 17 is a diagram showing a circuit example of the successive approximation control circuit in the successive approximation A/D converter of the first embodiment.
Figure 18:
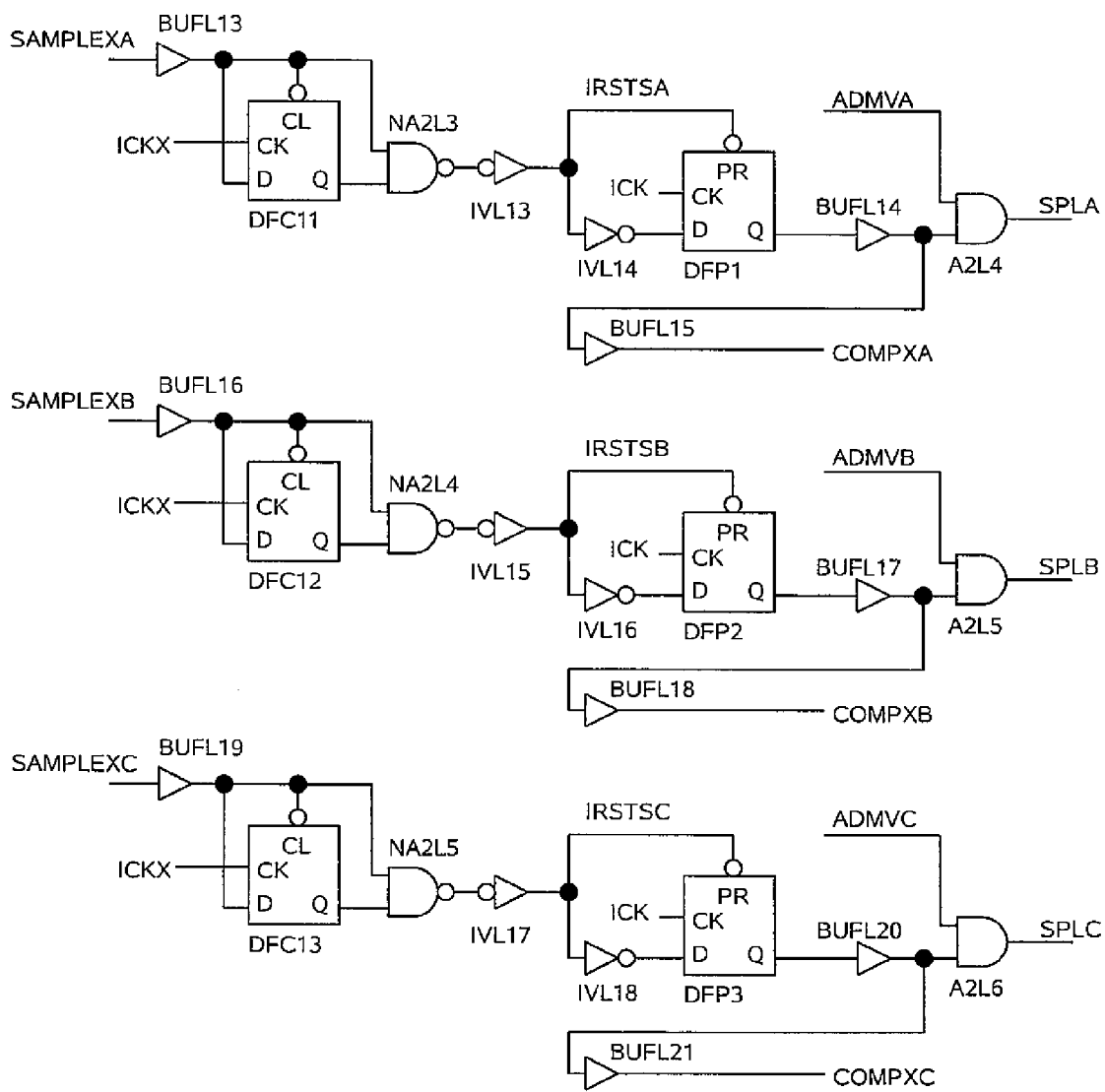
FIG. 18 is a diagram showing a circuit example of the successive approximation control circuit in the successive approximation A/D converter of the first embodiment.
Figure 19:
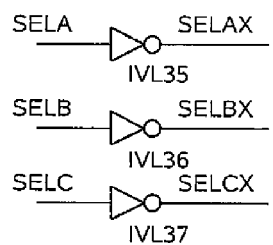
FIG. 19 is a diagram showing a circuit example of the successive approximation control circuit in the successive approximation A/D converter of the first embodiment.
Figure 19:
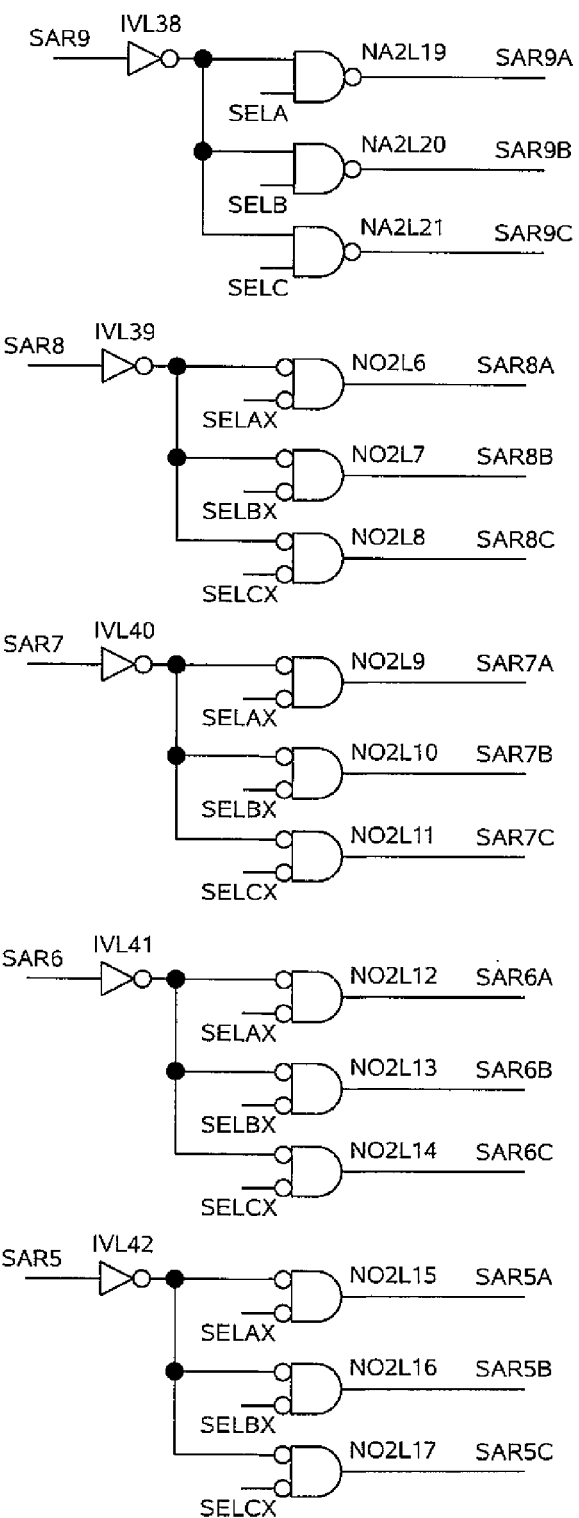

FIG. 10 shows a circuit example of MDACA, MDACB, or MDACC (capacitive main DAC). FIG. 11 shows a circuit example of SDAC (resistive sub DAC). FIG. 12 shows a circuit example of the comparators CMPA, CMPB, and CMPC. FIG. 13 shows a circuit example of the successive approximation control circuit. FIG. 14 shows a circuit example of a clock generating circuit for generating the clock signal to be supplied to the successive approximation control circuit of FIG. 13. FIGS. 15 and 16 show examples of the internal waveforms of the successive approximation control circuit of FIG. 13 and the clock generating circuit of FIG. 14. FIG. 17 is a diagram showing the digital data input section of the capacitive main DAC. FIG. 18 shows a circuit example of a section for generating control signals of FIG. 17. FIG. 19 shows a circuit example for generating capacitive DAC input signals for the respective channels.

As shown in FIG. 10, the portion of each of the switches SMA0', SMA0, SMA1, ..., SMA4 that is connected to Vref and GND includes a PMOS transistor and an NMOS transistor connected in series between Vref and GND. The portion of each switch that is connected to the analog input signal includes a transfer gate comprising a PMOS transistor and an NMOS transistor.

As shown in FIG. 11, the switches SS0 to SS31 in the resistive sub DAC each include a transfer gate comprising a PMOS transistor and an NMOS transistor. The portion of the switch SMA0' in the capacitive main DAC that is connected to the output DAC0 of the resistive sub DAC includes a switch constructed from a transfer gate comprising a PMOS transistor and an NMOS transistor. This switch is used to cut off the current to the resistor string, for example, when the resistive sub DAC is not in use.

FIG. 12 is a circuit diagram showing the comparators CMPA, CMPB, and CMPC in further detail at the transistor level. The circuit shown contains the comparators for all the three channels A to C. The circuit configuration is the same for each channel, and the working of the circuit is also the same; therefore, the following description relates only to the operation of the channel A comparator. The channel A comparator is the section that includes IVAA1, IVAA2, and IVAA3.

It is to be noted that SPL1A and SPL1XA are signals reversed relative to each other (complementary signals). For example, when SPL1A is "L", SPL1XA is "H", and when SPL1A is "H", SPL1XA is "L". Therefore, when SPL1A is "H", the input and output nodes of the respective inverters IVAA1, IVAA2, and IVAA3 are connected by the respective switches. Conversely, when SPL1A is "L", the switches are turned off, disconnecting the input and output nodes of the respective inverters. In other words, when SPL1A is "H", the potential of TOPA is held fixed to about one half of the supply voltage, and the comparator is thus put in the sampling state.

When ADMVCXA is set to "H", the inputs of IVAA1, IVAA2, and IVAA3 are connected to GND. The signal ADMVCXA is provided to connect the input of each inverter to GND and hold it in that state. Specifically, when ADMVCXA is set to "H", the comparator CMPA is put in the power-down state, and when ADMVCXA is set to "L", the comparator CMPA is put in the sampling or successive approximation state. A specific example of a circuit for generating ADMVCXA and its equivalents ADMVCXB and ADMVCXC will be described later. These signals can be derived from ADMVA, ADMVB, and ADMVC previously described with reference to FIG. 7.

When sampling, ADMVCXA is set to "L", and SPL1A is set to "H". When ADMVCXA is set to "L", NMAA4, NMAA5, and NMAA6 are turned off. When SPL1A is set to "H", TOPA is connected to the output node of IVAA1, and thus TOPA is brought to the same potential as the threshold voltage of IVVA1. Since TOPA is connected to the top plate of the capacitive main DAC (MDACA in FIG. 4), the top plate of the capacitive main DAC MDACA is at the same potential as the threshold voltage of IVVA1. At the same time, the input and output nodes of IVAA2 and IVAA3 are also respectively connected together, and thus these nodes are brought to the same potentials as the threshold voltages of IVAA2 and IVAA3, respectively. At this time, the difference voltage between the threshold voltage of IVVA1 and the threshold voltage of IVVA2 is applied across CCA1. Likewise, the difference voltage between the threshold voltage of IVVA2 and the threshold voltage of IVVA3 is applied across CCA2.

Next, to complete the sampling, SPL1A is set to "L". Thereupon, the input and output nodes of the three inverters are respectively disconnected. Here, TOPA and the output node of IVAA1 remain unchanged, each retaining the threshold voltage of IVVA1, because of the presence of a slight amount of parasitic capacitance at the input and output of the inverter. Likewise, the input and output nodes of IVVA2 remain unchanged, each retaining the threshold voltage of IVVA2, and the input and output nodes of IVVA3 also remain unchanged, each retaining the threshold voltage of IVVA3. In this condition, the node of TOPA is in the floating state, and the charges sampled into the MDACA cannot escape. Thus, MDACA enters the hold state.

Next, when performing the successive approximation conversion after the completion of the sampling, MDACA is operated to check to see if the potential of TOPA rises or falls. If TOPA rises, the output of IVAA1 falls. As a result, the potential at the input node of IVVA2 falls, and the potential at the output node of IVVA2 rises. This causes the potential at the input node of IVVA3 to rise, so that the potential at the output node of IVVA3 falls. Since each inverter has a gain of about 1:10, the amount of change of potential is multiplied as it passes through each inverter stage. With this action, the slight amount of potential change occurring on TOPA is amplified, and a signal representing the amplitude of the supply voltage is output at CMPAO. CMPAO, CMPBO, or CMPCO is selected by the selector SEL to produce CMPO. This CMPO is supplied to the successive approximation control circuit.

When the comparator need not be operated, for example, when it does not perform A/D conversion, or when the A/D conversion of the corresponding channel has been completed, the current consumption can be reduced by turning off power to the comparator. To accomplish this, SPL1A is set to "L", and ADMVCXA is set to "H". By so doing, the input nodes of all the inverters IVAA1, IVAA2, and IVAA3 are connected to GND, and thus the state of each inverter is fixed; in this condition, no static current flows. When the comparator is in the sampling state (SPL1 is "H" and ADMVCXA is "L"), inverter shoot-through current flows. Further, when performing the successive approximation conversion after the sampling, shoot-through current also flows, depending on the potential of TOPA.

While the above describes the working and operation of the channel A comparator, it will be appreciated that the working and operation is exactly the same for the comparators of the channels B and C.

The operation of the successive approximation control circuit SARP1 of FIG. 13 and the operation of the clock generating circuit of FIG. 14 are apparent from the signals of the various parts shown in the time charts of FIGS. 15 and 16, and therefore will not be further described herein.

The circuits of FIGS. 17 and 18 generate the comparator control signals SPLA, SPLB, and SPLC. The circuit of FIG. 17 also functions as a circuit for generating the capacitive main DAC input signals in conjunction with the circuit of FIG. 19. The circuit operation will not be further described herein.

FIGS. 20 to 22 are diagrams showing the simulation waveforms of the various parts when the successive approximation A/D converter of the first embodiment is implemented using the circuits shown in FIGS. 10 to 19.

Figure 20A:
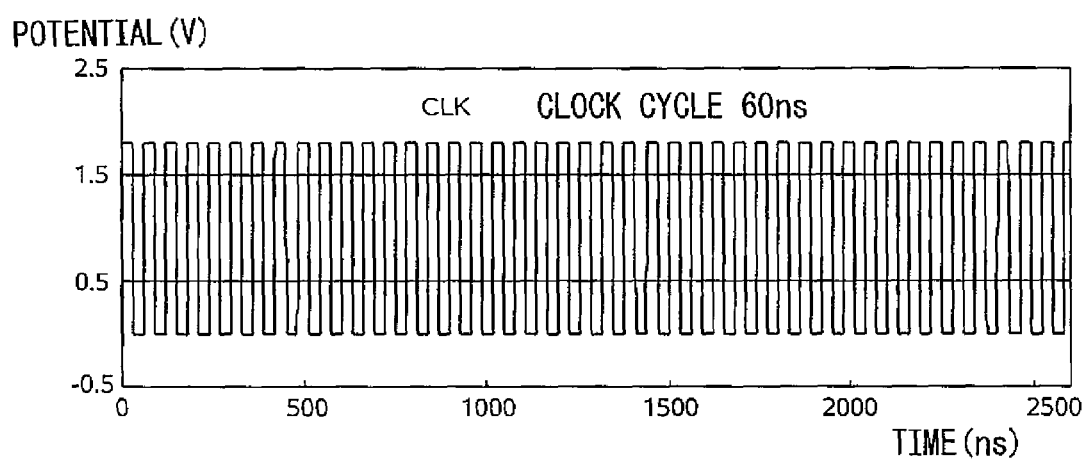
FIGS. 20A to 20D are diagrams showing operating waveforms of the successive approximation A/D converter of the first embodiment.

FIG. 20A shows the waveform of the clock input CLK. In the waveform diagrams given herein, the ordinate represents the potential, and the abscissa the time. Examples of the calculation results of the various waveforms are shown here by assuming that one clock cycle occurs in 60 ns.

Figure 20B:
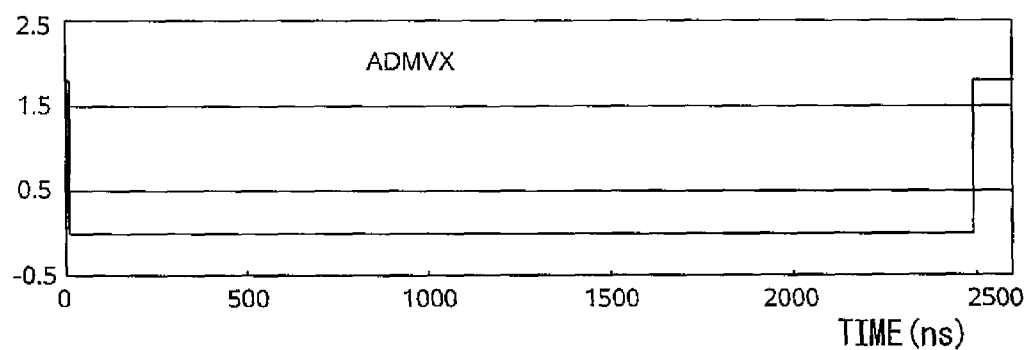

FIG. 20B shows the waveform of ADMVX of FIG. 4. ADMVX is set to "L" to operate the resistive sub DAC about 0 ns after starting the analysis, and thereafter ADMVX is held at "L" until the A/D conversion of the three channels of analog signals is completed.

Figure 20C:
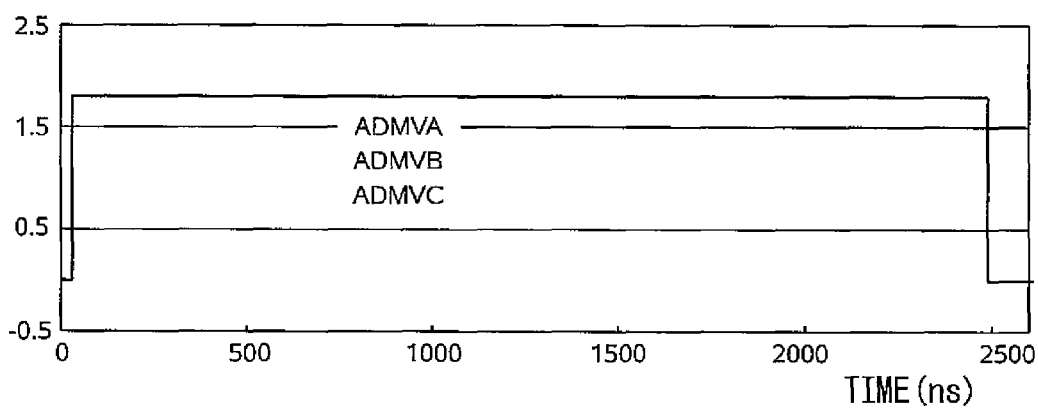

FIG. 20C shows the waveform of ADMVA, ADMVB, and ADMVC of FIG. 4. Almost at the same time that ADMVX is set to "L" to operate the resistive sub DAC, ADMVA, ADMVB, and ADMVC are set to "H" to operate the respective comparators CMPA, CMPB, and CMPC. Thereafter, the ADMVA, ADMVB, and ADMVC are held at "H" until the A/D conversion of the three channels of analog signals is completed.

Figure 20D:
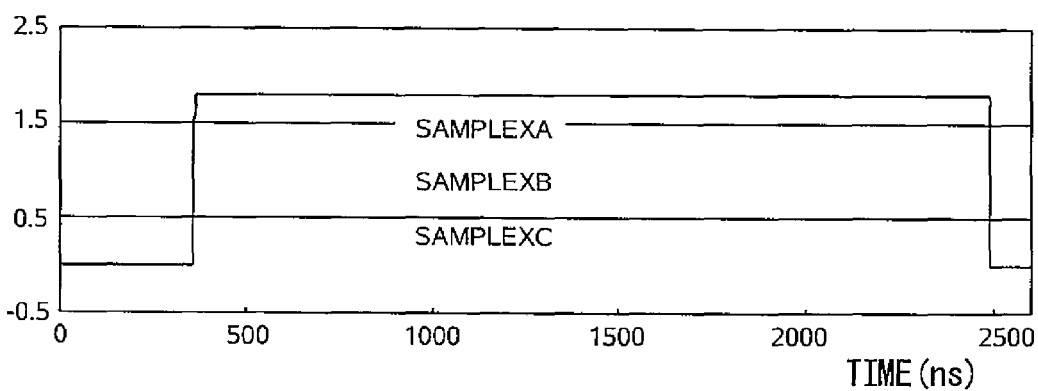

FIG. 20D shows the waveform of SAMPLEXA, SAMPLEXB, and SAMPLEXC of FIG. 4. About 400 ns after setting ADMVA, ADMVB, and ADMVC to "L" to operate the comparators CMPA, CMPB, and CMPC, SAMPLEXA, SAMPLEXB, and SAMPLEXC are caused to change from low to high, thus simultaneously ending the sampling of the three analog signals. Thereafter, SAMPLEXA, SAMPLEXB, and SAMPLEXC are held at "H" until the A/D conversion of the three channels of analog signals is completed.

FIGS. 21A to 21D show the waveforms of SELA, SELB, and SELC, respectively, of FIG. 4. During the period from the start of the sampling to the end of the VINA signal conversion, SELA is held at "H", while SELB and SELC are held at "L". At a time instant of about 1000 ns, to start the conversion of VINB, SELA is set to "L" and SELB is set to "H" while holding SELC at "L". Further, at a time instant of about 1800 ns, to start the conversion of VINC, SELB is set to "L" and SELC is set to "H" while holding SELA at "L".

Figure 21A:
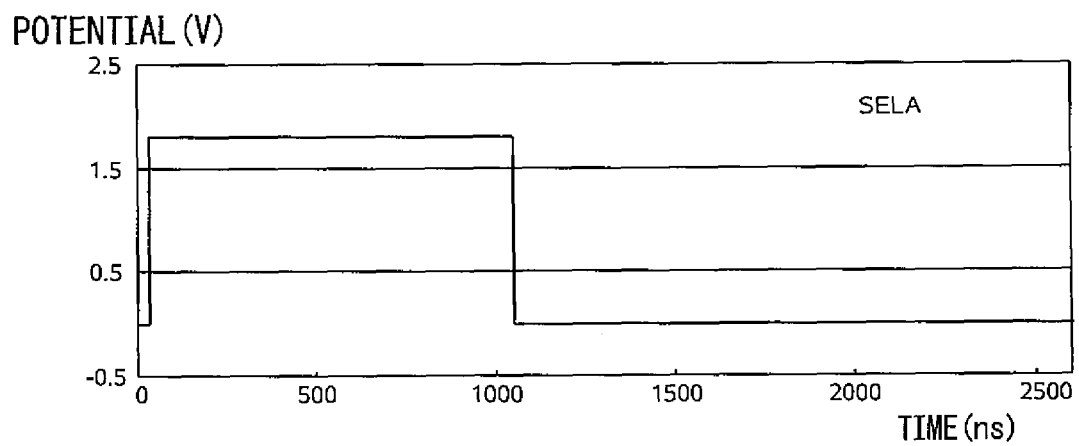
FIGS. 21A to 21D are diagrams showing operating waveforms of the successive approximation A/D converter of the first embodiment.
Figure 21B:
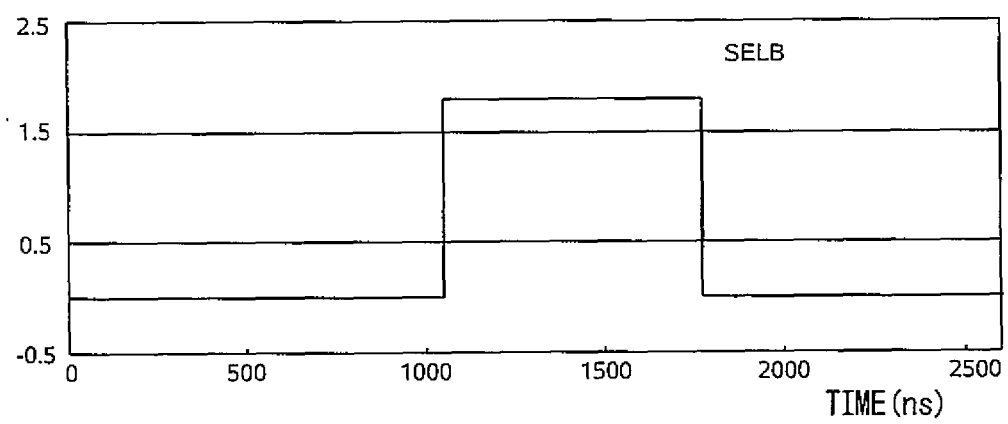
Figure 21C:
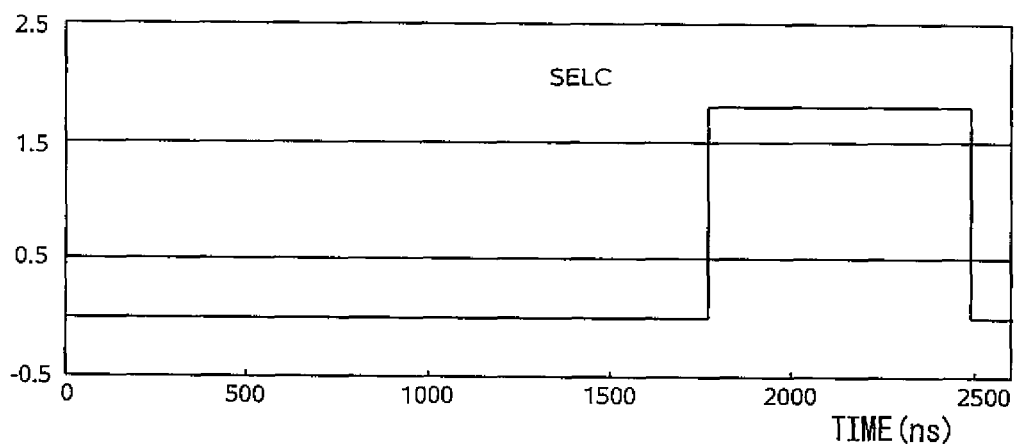
Figure 21D:
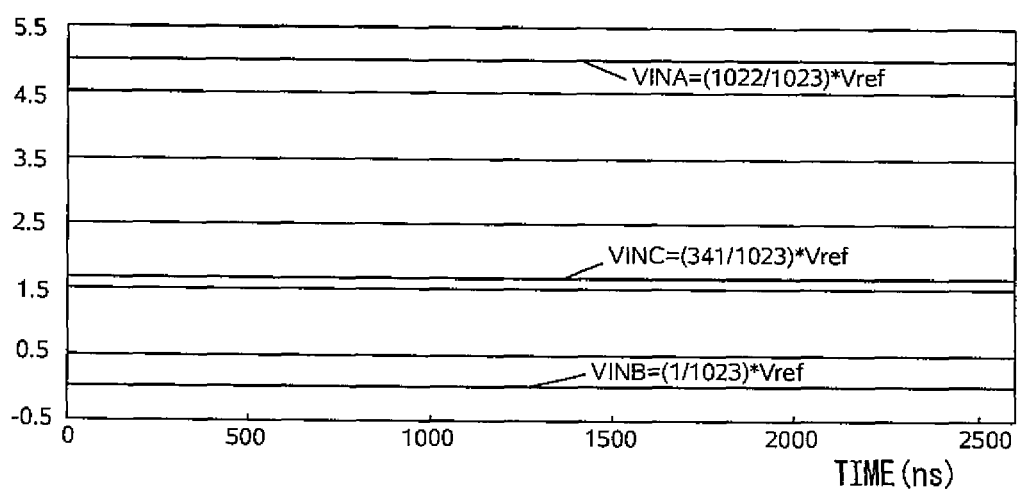

FIG. 21D shows the waveforms of VINA, VINB, and VINC, respectively, of FIG. 4. With 5V as the conversion reference voltage Vref, the values of VINA, VINB, and VINC are calculated as constant values (1022/1023)×Vref, (1/1023)×Vref, and (341/1023)×Vref, respectively. The expected values of the conversion results are 1022, 1, and 341, respectively, when expressed in decimal notation. If the decimal number 1022 is expressed in binary notation, only the least significant bit of the 10 bits is 0, and the bits from MSB to the second least significant bit are all 1s. If the decimal number 1 is expressed in binary notation, only the least significant bit of the 10 bits is 1, and the bits from MSB to the second least significant bit are all 0s. The decimal number 341 is expressed as a binary number whose value alternately cycles between 0 and 1.

Figure 22A:
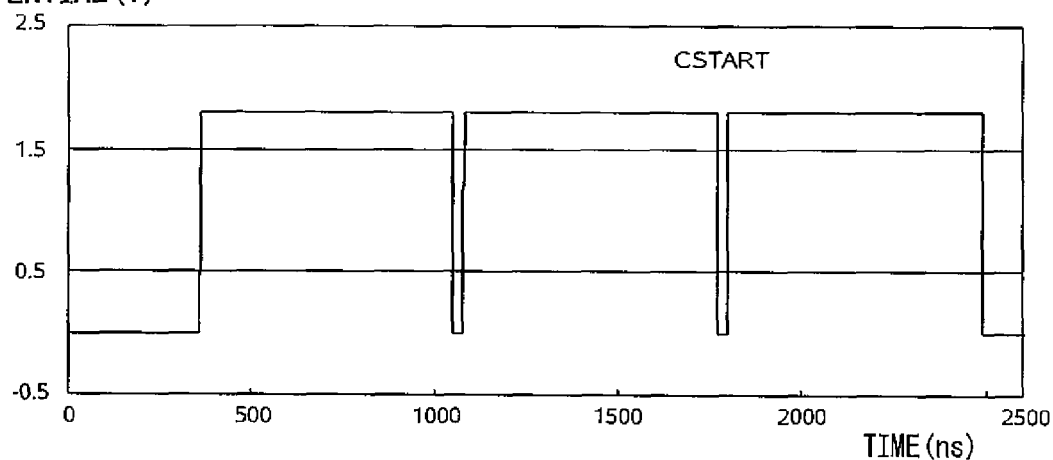
FIGS. 22A to 22C are diagrams showing operating waveforms of the successive approximation A/D converter of the first embodiment.

FIG. 22A shows the waveform of the successive approximation start control signal CSTART. The conversions of the channels A, B, and C respectively start one clock cycle after the first, second, and third rising edges of CSTART.

Figure 22B:
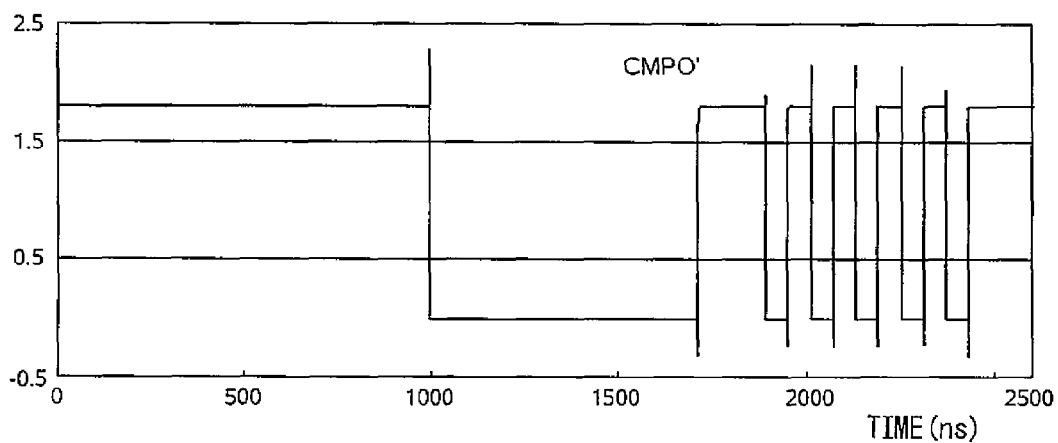

FIG. 22B shows the waveforms representing the comparator outputs CMPAO, CMPBO, and CMPCO as selected by the selector SEL and captured by a latch circuit (i.e. the portions of CMPO that have been captured by the latch circuit, the captured signal being generally represented by CMPO' in the figure). As described with reference to FIGS. 21A to 21D, the expected value of the conversion result for the channel A is 1111111110, the expected value of the conversion result for the channel B is 0000000001, and the expected value of the conversion result for the channel C is 0101010101.

During the period when SELA is "H", the waveform of CMPO' in FIG. 22B remains at 1 from the start of the successive approximation cycle nearly to the end thereof, and changes to 0 shortly before the end of the channel A conversion cycle (i.e. shortly before CSTART falls to "L"). Since the comparator output (in this case, CMPO') represents the bits arranged in decreasing order of their significance along the time axis, it can be seen that the conversion result for the channel A has been obtained as predicted by the expected value (1111111110).

After CSTART has risen for the second time, the waveform of CMPO' in FIG. 22B remains at 0 from the start of the successive approximation cycle nearly to the end thereof, and changes to 1 shortly before the end of the channel B conversion cycle (that is, shortly before CSTART falls to "L"). Since the comparator output (in this case, CMPO') represents the bits arranged in decreasing order of their significance along the time axis, it can be seen that the conversion result for the channel B has been obtained as predicted by the expected value (0000000001).

After CSTART has risen for the third time, the waveform of CMPO' in FIG. 22B alternately cycles between 0 and 1. Since the comparator output (in this case, CMPO') represents the bits arranged in decreasing order of their significance along the time axis, it can be seen that the conversion result for the channel C has been obtained as predicted by the expected value (0101010101).

Figures 22C, 23:
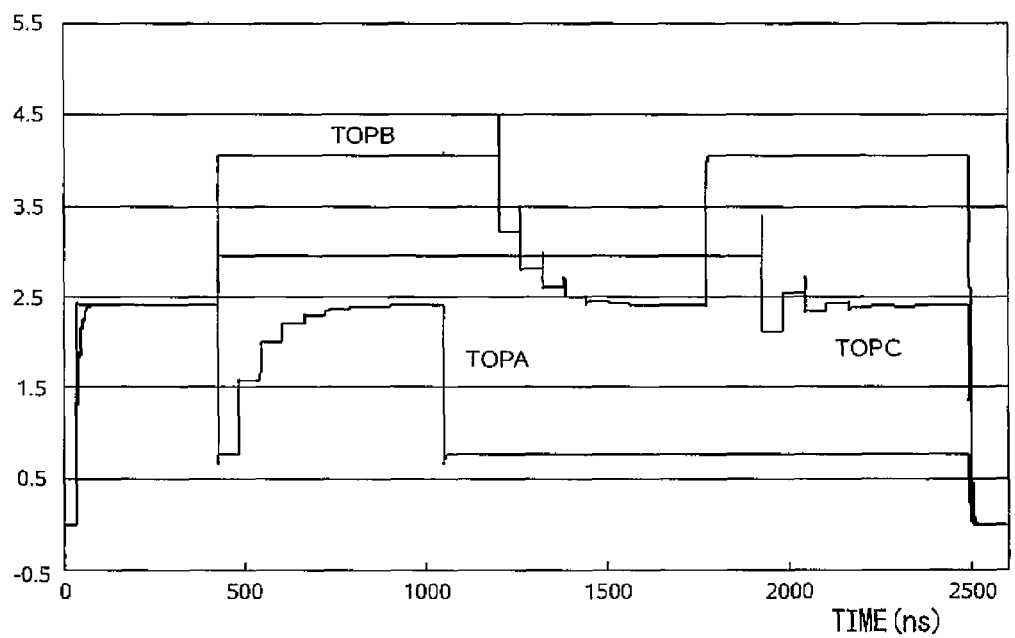
FIG. 23 is a diagram showing a comparison table for explaining the effect of reducing the amount of circuitry in the successive approximation A/D converter of the first embodiment in comparison with the prior art.

FIG. 22C shows the waveforms representing the potentials at the top plates TOPA, TOPB, and TOPC of the respective capacitive DACs MDACA, MDACB, and MDACC. During the channel A compare period, the potential of TOPA is brought closer to 2.5 V (substantially the same as the potential of VTL) by an input from SARP1, thus exhibiting a successive approximation operation. During this time, the potentials of TOPB and TOPC are each fixed for a comparison between the sampling potential and ½. This is because the inputs of the capacitive DACs other than the DAC of the selected channel are fixed to ½ by the circuit of FIG. 19. While FIG. 19 shows a circuit example in which the potential of each deselected channel is fixed to ½, TOPB and TOPC may be placed in the floating state during the period when VINA is compared using TOPA. If such changes are made as needed to the detailed circuit operation, the analog signals simultaneously sampled in accordance with the present embodiment can be converted in sequence, and the effect of reducing the amount of circuitry can be achieved.

After the channel A analog signal has been converted using TOPA, TOPA is held fixed at the same potential as the potential in the first cycle of the successive approximation. This is because, in the example of the circuit employed here, SAR9A to SAR5A are fixed to ½ during the conversion of the channel B. At the same time, the potential of TOPB is brought closer to 2.5 V (substantially the same as the potential of VTL) by an input from SARP1, thus exhibiting a successive approximation operation. During this time, the potential of TOPC is fixed to ½.

When the successive approximation operation of TOPB is completed, TOPB is also held fixed at the same potential as the potential in the first cycle of the successive approximation. The potential of TOPC is brought closer to 2.5 V (substantially the same as the potential of VTL) by an input from SARP1, exhibiting a successive approximation operation. During this time, the potential of TOPA is fixed to ½.

As described above, the operation of the A/D converter of the first embodiment shown in FIG. 4 can be implemented using the circuits of FIGS. 10 to 19, and since their internal potentials are controlled as shown in FIGS. 20 to 22, the desired operation can be achieved.

FIG. 23 shows a comparison table for comparing the number of circuit blocks needed when implementing the three-channel simultaneous sampling A/D converter in accordance with the first embodiment and the number of circuit blocks needed when implementing it using the prior art shown in FIGS. 2 and 3. As shown in the table, the capacitive elements refer to the capacitive main DACs used in the A/D converter, as well as the voltage holding capacitors used in the sample-and-hold circuits. Since these two types of capacitive elements take up substantially the same chip area, they are collectively counted as capacitive elements.

The prior art of FIG. 2, which comprises three A/D converters, requires the provision of as many capacitive elements, resistive sub DACs, comparators, and successive approximation control circuits. Since the sample-and-hold function is implemented within each capacitive main DAC, amplifiers as used in sample-and-hold circuits are not required here. On the other hand, the prior art of FIG. 3, which comprises three sample-and-hold circuits and one A/D converter, requires the provision of a total of four capacitive elements, three for the sample-and-hold circuits and one for the A/D converter. While this prior art requires the provision of only one resistive sub DAC, one comparator, and one successive approximation control circuit, a total of three amplifiers are required, one for each of the three sample-and-hold circuits. By contrast, the first embodiment comprises three capacitive main DACs, three comparators, one resistive sub DAC, and one successive approximation control circuit. Since the sample-and-hold function is implemented within each capacitive main DAC, amplifiers as used in sample-and-hold circuits are not required.

Compared with the prior art shown in FIG. 2, the first embodiment can eliminate the need for two resistive sub DACs and two successive approximation control circuits.

Compared with the prior art shown in FIG. 3, the first embodiment can reduce the number of capacitive elements by one. Since the capacitive element takes up the largest area within the A/D converter, the resulting effect is significant. Furthermore, since amplifiers as used in sample-and-hold circuits are not required, the steady-state current consumed by amplifiers can be reduced. The configuration that uses the sample-and-hold circuits as in the prior art shown in FIG. 3 has the problem that voltages near the power rails cannot be sampled. The first embodiment can avoid this problem because the analog inputs can be directly sampled by the capacitive DACs.

Figure 24:
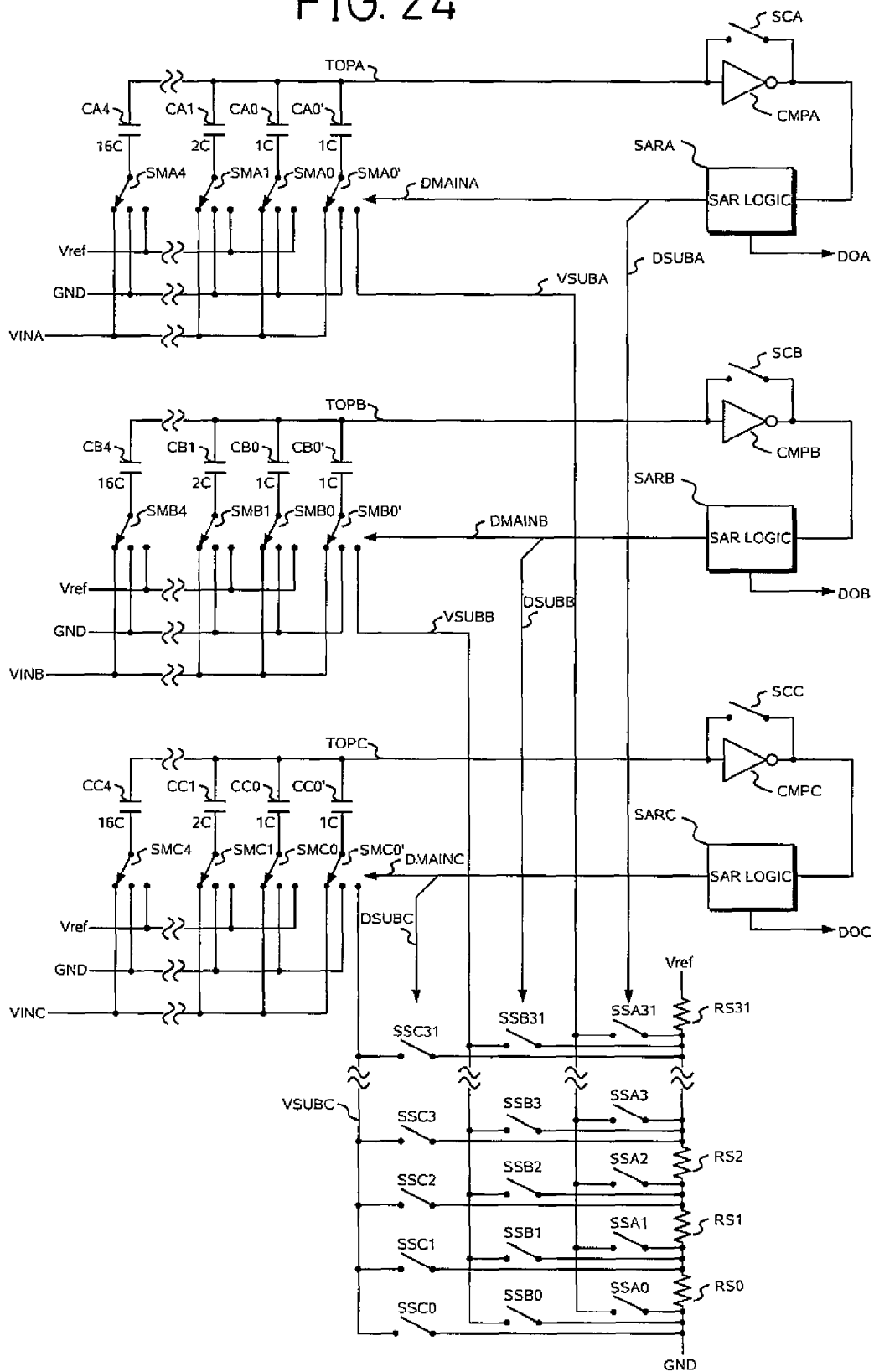
FIG. 24 is a diagram showing the configuration of a successive approximation A/D converter having a multiple-channel simultaneous sampling function according to a second embodiment.

FIG. 24 is a diagram showing the configuration of a successive approximation A/D converter having a three-channel simultaneous sampling function according to a second embodiment.

Figure 1:
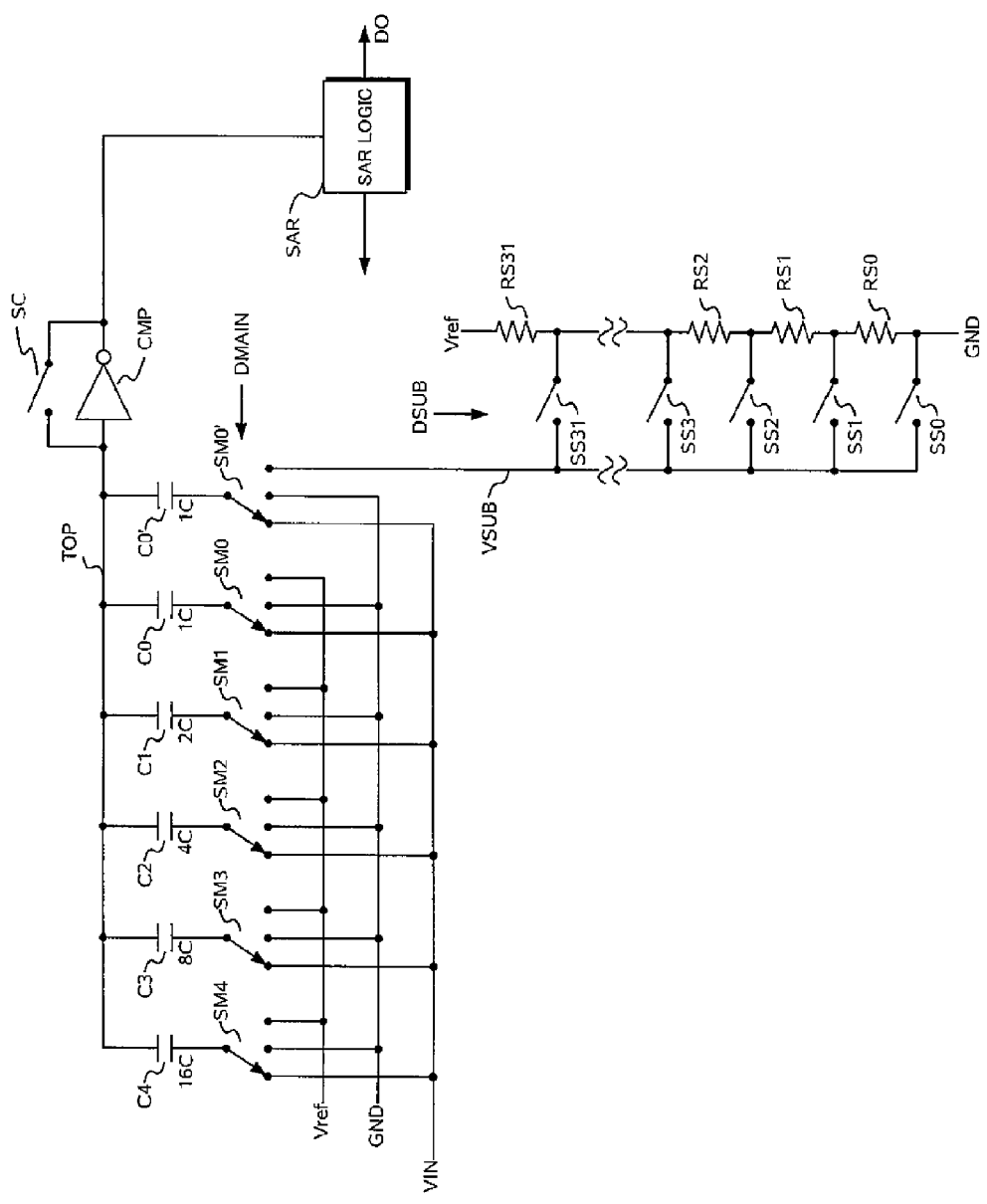
FIG. 1 is a diagram showing a circuit example of a 10-bit successive approximation A/D converter that uses a capacitor array for a main DAC and a resistor array for a sub DAC.

The A/D converter of the second embodiment comprises three converter units, each identical to the one shown in FIG. 1, i.e. three capacitive main DACs, three comparators, three successive approximation control circuits, and three switch arrays for connecting the connection nodes of the resistor string in the resistive sub DAC to the respective outputs of the resistive sub DAC; here, the resistor string in the resistive sub DAC is shared among the three converter units. The configuration and operation of the various parts of the second embodiment are the same as those of the first embodiment, and will not be described in detail here.

In the second embodiment, only one resistor string consisting of RS0, RS1, RS2, ..., RS31 is provided in the resistive sub DAC, but three switch arrays are provided to connect the connection nodes of the resistor string in the resistive sub DAC to the respective outputs of the resistive sub DAC. More specifically, the first switch array comprises SSA0, SSA1, SSA2, ..., SSA31 that are controlled by the control signal DSUBA from the successive approximation control circuit SARA. The second switch array comprises SSB0, SSB1, SSB2, ..., SSB31 that are controlled by the control signal DSUBB from the successive approximation control circuit SARB. The third switch array comprises SSC0, SSC1, SSC2, ..., SSC31 that are controlled by the control signal DSUBC from the successive approximation control circuit SARC. Accordingly, by controlling the three switch arrays independently of each other, three independent voltages VSUBA, VSUBB, and VSUBC can be output. With this configuration, successive approximation conversion can be performed simultaneously on the three channels. As described earlier, in the first embodiment, it has not been possible to perform successive approximation conversion simultaneously on the three channels.

Figure 25:
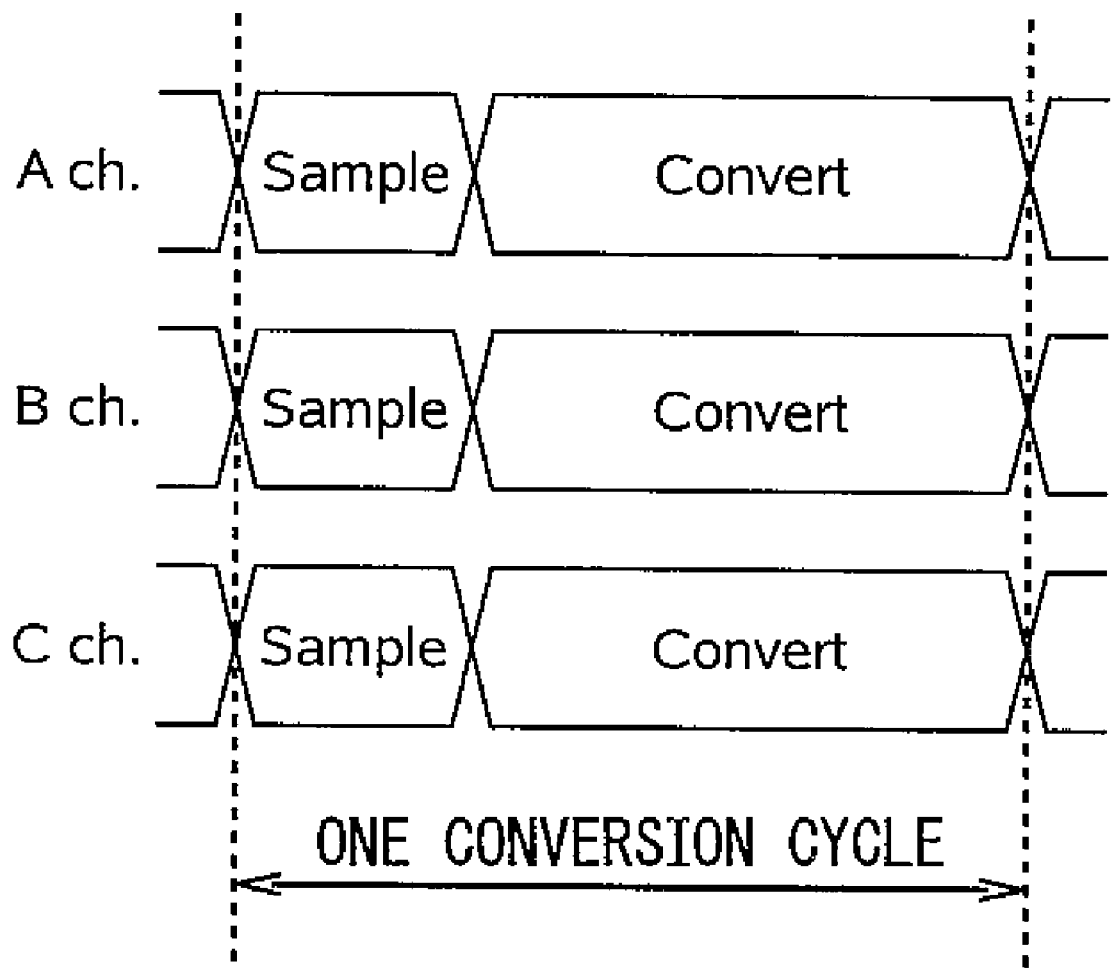
FIG. 25 is a time chart showing the A/D conversion timing employed in the successive approximation A/D converter of the second embodiment.

FIG. 25 is a diagram for explaining in what sequence the sampling and the successive approximation conversion are performed in the second embodiment. As shown in FIG. 25, the sampling and the successive approximation conversion are each performed simultaneously in concurrent fashion. The operation of each process is the same as that described in the first embodiment, and therefore the description will not be repeated here.

In the first embodiment, after the three channels A, B, and C have been sampled simultaneously, the successive approximation conversion of the channel A is performed. During that time, the channels B and C are maintained in the hold state. After the successive approximation conversion of the channel A is completed, the successive approximation conversion of the channel B is performed. During that time, the channel C is maintained in the hold state, but the channel A for which the digital conversion is already completed need not be maintained in the hold state. After the successive approximation conversion of the channel B is completed, the successive approximation conversion of the channel C is performed. During that time, the channels A and B for which the digital conversion is already completed need not be maintained in the hold state. In other words, in the first embodiment, the successive approximation conversion is performed three times in sequence, one for each channel. By contrast, in the second embodiment, after the three channels A, B, and C have been sampled simultaneously, the successive approximation conversion is performed simultaneously on the three channels A, B, and C.

Compared with the first embodiment, the second embodiment that performs the conversion cycle simultaneously can shorten the conversion cycle.

Compared with the prior art example of FIG. 2 which requires three resistor strings, the second embodiment, which requires only one resistor string, can reduce the circuit area required. In this way, according to the second embodiment, the successive approximation A/D converter that can perform the successive approximation conversion simultaneously on three channels as in the prior art example shown in FIG. 2 can be implemented at a lower cost.

Figure 26:
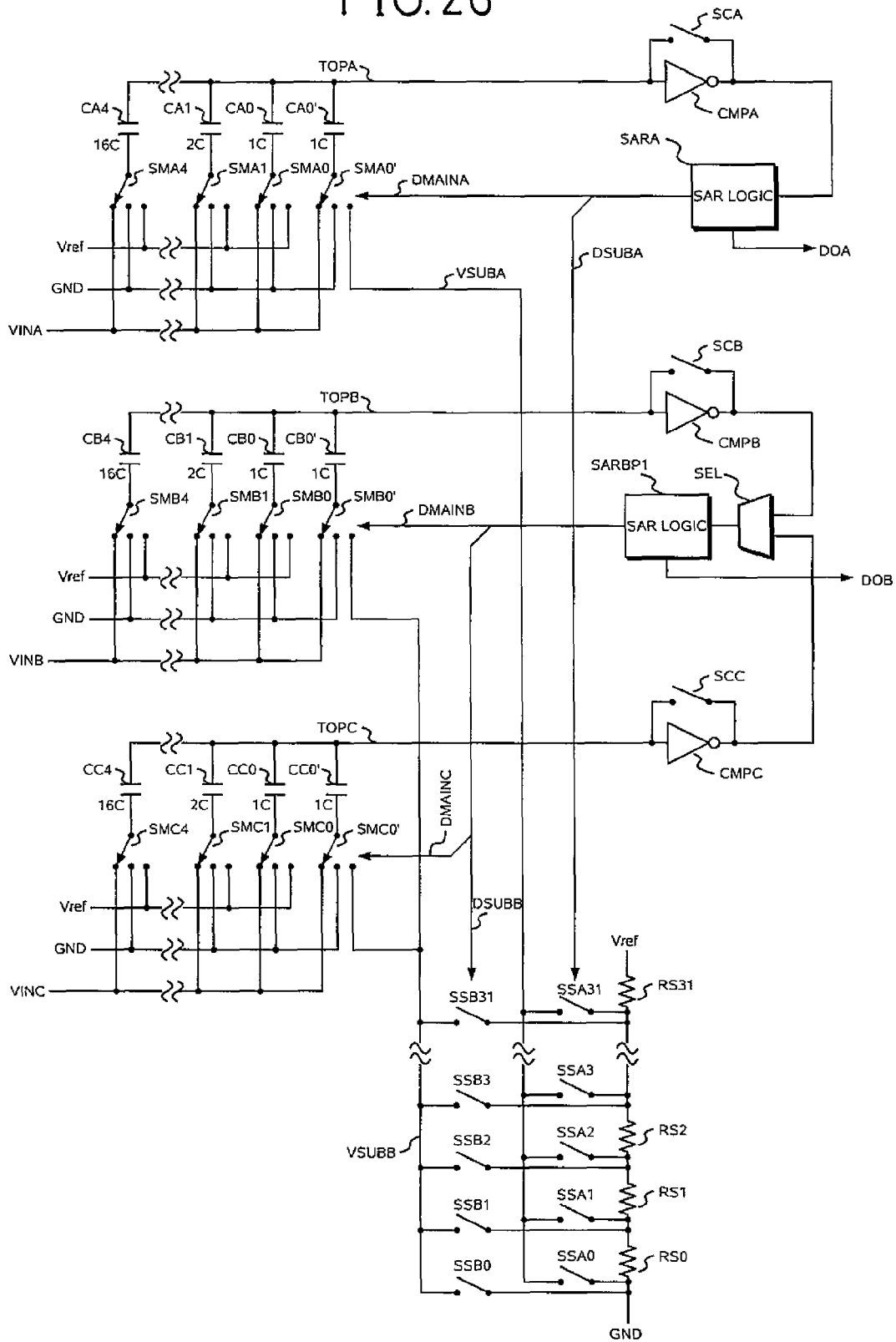
FIG. 26 is a diagram showing the configuration of a successive approximation A/D converter having a multiple-channel simultaneous sampling function according to a third embodiment.

FIG. 26 is a diagram showing the configuration of a successive approximation A/D converter having a three-channel simultaneous sampling function according to the third embodiment.

The A/D converter of the third embodiment differs from that of the second embodiment in that the number of switch arrays for connecting the connection nodes of the resistor string in the resistive sub DAC to the respective outputs of the resistive sub DAC is reduced to two, and in that one of the outputs of the resistive sub DAC is connected in common to the capacitive main DACs of the channels B and C. The configuration and operation of the various parts of the third embodiment are the same as those of the second embodiment, and will not be described in detail here.

The configuration of the third embodiment is somewhat in between those of the first and second embodiments. In the third embodiment, the three channels are simultaneously sampled, but the successive approximation conversion is performed simultaneously on two channels (A and B or A and C), and after the successive approximation conversion of the two channels is completed, the successive approximation conversion is performed on the remaining channel.

In the third embodiment, since the comparators are provided, one for each channel, and the path for fixing the potential of the top plate during the sampling is also provided for each individual channel, sampling times can be staggered among the three channels.

Figure 27A:
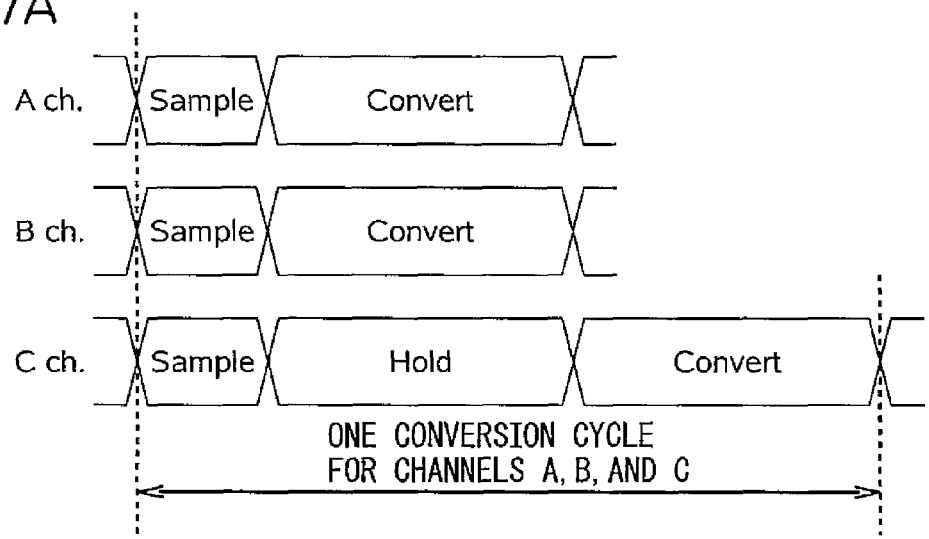
FIGS. 27A and 27B are time charts showing the A/D conversion timing employed in the successive approximation A/D converter of the third embodiment.
Figure 27B:
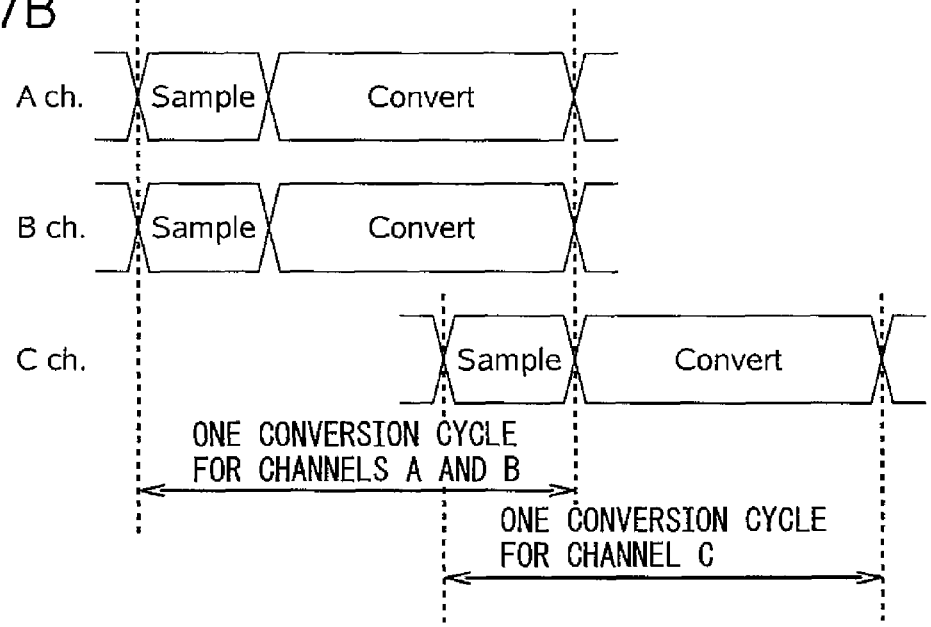

FIGS. 27A and 27B are diagrams for explaining in what sequence the sampling and the successive approximation conversion are performed in the third embodiment. In the example shown in FIG. 27A, the three channels are simultaneously sampled, and thereafter the successive approximation conversion is performed on the channels A and B, during which time the channel C is maintained in the hold state. After the successive approximation conversion of the channels A and B is completed, the successive approximation conversion is performed on the channel C. In this example, since the successive approximation conversion can be performed simultaneously on two channels, the conversion cycle can be shortened compared with the first embodiment, though it becomes longer compared with the second embodiment.

In the example shown in FIG. 27B, the channels A and B are simultaneously sampled, and thereafter the successive approximation conversion is performed simultaneously on the channels A and B. The channel C is sampled at some other suitable time, and thereafter the successive approximation conversion of the channel C is performed during the period when the successive approximation conversion of the channel B is not being performed. This example can be applied to motor control in which the channels A and B are used for U-phase and W-phase detection and the channel C for the detection of disconnected wiring.

The first to third embodiments have been described above. These embodiments have been described by taking the case of three channels as an example, but the number of channels is not limited to any specific number, the only requirement being that there be two or more channels.

In the first and third embodiments, the successive approximation conversion that comprises the conversion using the capacitive main DAC and the conversion using the resistive sub DAC has been performed in sequence on a channel-by-channel basis for those channels that share the same resistive sub DAC. However, since the capacitive main DACs are independent of each other, only the successive approximation conversion using the resistive sub DAC may be performed in sequence, and the successive approximation conversions using the respective capacitive main DACs may be performed in concurrent fashion. In this case, however, the sequence of the successive approximation control circuit must be changed.

Next, a description will be given of how the simultaneous sampling A/D converter so far described can be applied to motor control.

Motors can be classified into two basic types. One is the brushed motor, and the other is the brushless motor. A wound-field DC motor is a representative example of the brushed motor, and has the longest history of use. Brushless motors can be classified into two main types, induction motor and synchronous motor. The induction motor is a motor that rotates based on the principle of Arago's disc; i.e. a rotating magnetic field is generated in the stator, and the current induced in the electrical conductor of the rotor produces a rotational torque proportional to the slip, thus causing the rotor to rotate. In the synchronous motor, on the other hand, the rotor is provided with a field capability, and the rotating magnetic field generated in the stator produces rotation. In this case, the rotor rotates synchronously with the rotating magnetic field, and hence the name synchronous motor.

The brushed motor represented by the wound-field DC motor has long been used as a variable speed motor because of its good controllability. However, because of the use of brushes (mechanical rectifier), it has the problem that it requires maintenance and, when the brushes wear out, the motor life ends. On the other hand, the brushless motor has the advantage of long life but, because it does not use brushes, it requires a power supply for generating the rotating magnetic field, and rotation cannot be produced by simply applying DC power as in the case of the brushed motor. To generate the rotating magnetic field, a method that uses three-phase AC power has traditionally been employed. However, when applying three-phase AC power directly to the motor, it is difficult to control the rotational speed because the frequency of the power cannot be varied. Therefore, in their early days, brushless motors were not used in variable speed applications, but wound-field DC motors with brushes were used.

Thereafter, advances in electronic control technology have led to the development of a method that controls the speed of brushless motors by generating the rotating magnetic field by controlling switches using a processor and logic circuits. This motor control mechanism is called inverter control, because it creates AC power from DC power. With the advent of inverter control technology, it has become possible to use brushless motors in variable speed applications, and the problem associated with the brush life has been solved. Furthermore, in recent years, a technique called vector control that performs sophisticated electronic control has come to be used in order to enhance the energy efficiency of motors. Nowadays, brushless motors can be driven in a well controlled manner by employing such electronic control, and in many applications, it is advantageous to use brushless motors rather than using brushed motors.

Of the two types of brushless motor, the induction motor requires slip because of its operating principle, and copper loss proportional to the slip occurs within the rotor; as a result, its energy efficiency is lower than that of the synchronous motor. Therefore, in a system that aims to enhance the efficiency by using vector control, a synchronous motor is used. Among others, permanent magnet synchronous motors that use a permanent magnet as the rotor are widely used because of their compact design and high-performance capability.

There are two methods for driving the permanent magnet synchronous motor: one that does not detect the rotor position, and the other that detects the rotor position. When driving the permanent magnet synchronous motor without detecting the rotor position, the phase difference between the current and the rotor settles down where the power applied to the motor and the load torque balance each other out. If the load increases, the phase difference increases, and eventually a step out occurs. On the other hand, if the supply voltage is high despite a light load, the current increases. There is therefore a need to select a supply voltage that matches the load.

When driving the permanent magnet synchronous motor by detecting the rotor position, control is performed by applying a current with a prescribed phase difference added to the rotor position so that the phase difference between the current and the rotor is locked. In this case, motor torque is determined by the magnitude of the current, which in turn is determined by the supply voltage and induced voltage or their phase difference. In steady-state operation, if the load increases, the speed decreases and, hence, the induced voltage decreases, as a result of which the current increases, increasing the motor torque, and the operation stabilizes at a new speed; accordingly, to maintain the speed at a constant level, it is necessary to detect the speed, adjust the voltage so as to achieve a constant speed, and supply a motor current that matches the load torque. In other words, compared with the driving method that does not detect the rotor position, this latter method has the advantages that the current that matches the load flows, and that there is no concern of step out.

Figure 28:
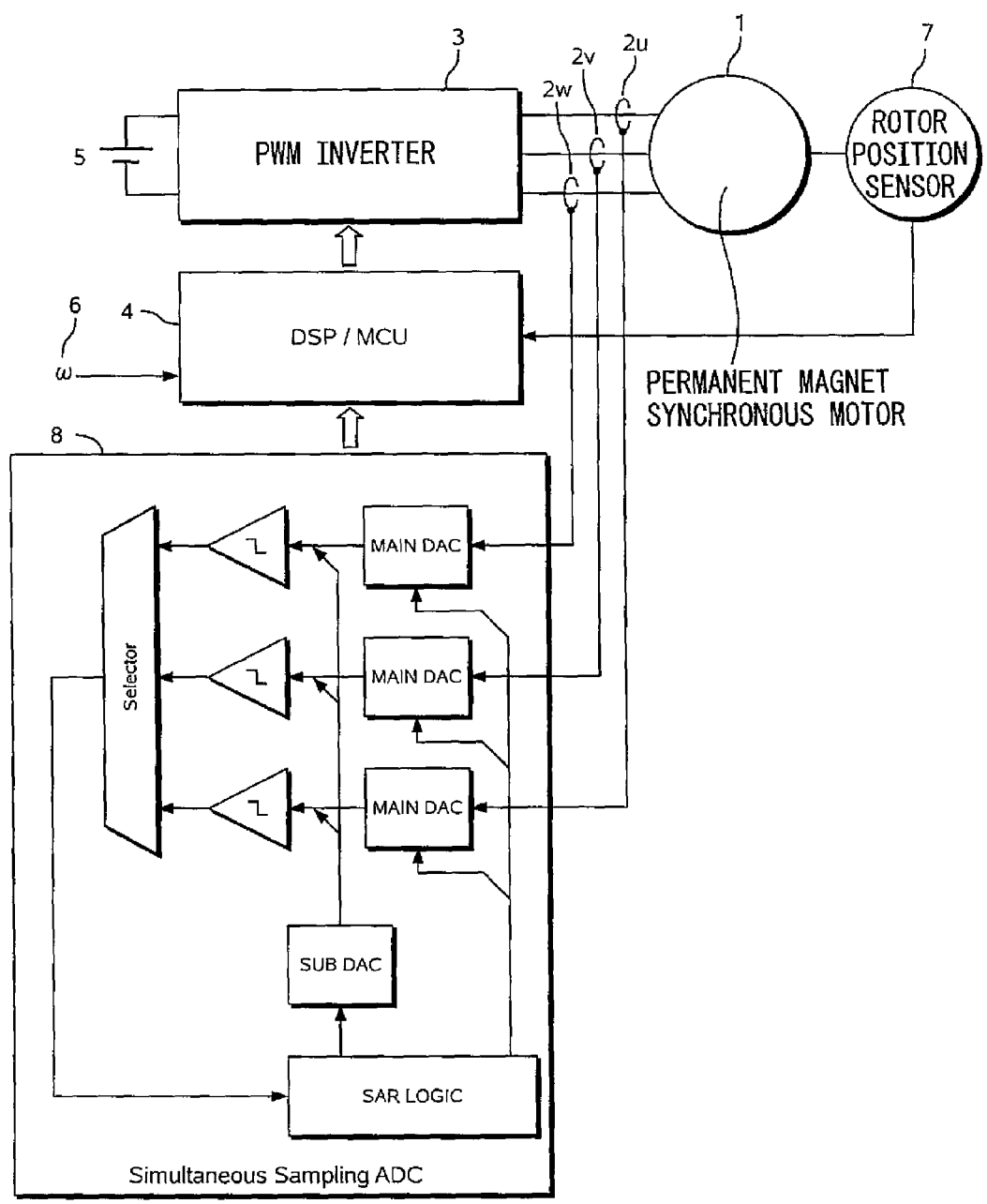
FIG. 28 is a diagram showing the configuration of the successive approximation A/D converter of the embodiment as applied to a system that drives a permanent magnet synchronous motor by vector control.

The above describes how an efficient system can be implemented by knowing the rotor position of the permanent magnet synchronous motor, but it will be noted that a more efficient system can be implemented by using vector control. FIG. 28 shows an example in which the successive approximation A/D converter of the embodiment is applied to this driving system. In FIG. 28, reference numeral 1 is the permanent magnet synchronous motor as a control target, 2u, 2v, and 2w are sensors for detecting the V-phase current, U-phase current, and W-phase current of the motor, 3 is an inverter device for generating alternating current from direct current by PWM (Pulse Width Modulation), 4 is a processor for performing electronic control, 5 is a voltage source indicating that direct current is supplied to the inverter device, 6 is a motor speed set value, 7 is a sensor for detecting rotor position, and 8 is the A/D converter having a three-channel simultaneous sampling function according to the present embodiment.

The control target is the permanent magnet synchronous motor 1, and information on the currents (2u, 2v, and 2w) flowing in the motor and an analog signal from the position sensor 7 are supplied to the processor 4 via the A/D converter 8. Based on the received information and the speed set value 6, the processor 4 calculates the relationship between the magnetic flux and the current phase so as to maximize the torque, and controls the inverter device 3 accordingly. The inverter device drives the permanent magnet synchronous motor 1 by generating a voltage of PWM waveform based on the signal supplied from the processor 4.

A sensor such as an optical encoder, a Hall element, an MR sensor, or a resolver may be used as the position sensor 7, but depending on the environment where the motor is installed, or in high speed applications, there can occur cases where the position sensor cannot be installed. In view of this, a sensorless technique has been developed that eliminates the need for the position sensor and estimates the position from the current information supplied to the motor. In the sensorless system, the position sensor 7 shown in FIG. 28 is omitted.

The A/D converter 8 may be implemented in the form of an integrated circuit in which the processor 4 is also integrated. The methods of the prior art shown in FIGS. 2 and 3 may be employed to implement the A/D converter 8. However, by applying the present embodiment to the A/D converter used here, the area that the A/D converter takes up can be reduced, while also achieving a reduction in current consumption.

The permanent magnet synchronous motor driving system of FIG. 28 may be implemented using various other configurations and algorithms, ranging from a simple one to a sophisticated one. Depending on such factors as the presence or absence of speed detection information, the presence or absence of motor current information, and the presence or absence of torque setting, the necessary sensors, the method of estimation, and the method for implementing their functions differ, and suitable ones are selected for use according to the purpose. For these other configurations also, the present embodiment is applicable in most cases.

The electronic control of the permanent magnet synchronous motor has been described above. Next, the control of the induction motor will be described.

The variable speed control of the induction motor can be achieved either by varying the slip or by varying the power supply frequency. Examples of the method that varies the slip include primary voltage control and secondary power control. The primary voltage control method achieves variable speed control by varying the primary voltage using a thyristor or the like and thereby varying the torque characteristics of the induction motor. The shortcoming of this method is poor efficiency. The secondary power control method performs speed control by bringing out the secondary winding and by attaching a resistor to control the secondary power or by recovering the secondary power into the power line.

Examples of the method that varies the power supply frequency of the induction motor include V/f constant control and vector control. The V/f constant control method varies the power supply frequency and the supply voltage by the same proportion and can achieve a good torque characteristic over a wide speed range. The vector control method controls the current supplied to the induction motor as the exciting current and the torque current, respectively. Using the vector control, the torque can be linearized, and high control performance can be obtained. For small motors, V/f constant control and vector control are widely used as variable speed driving schemes.

Figure 29:
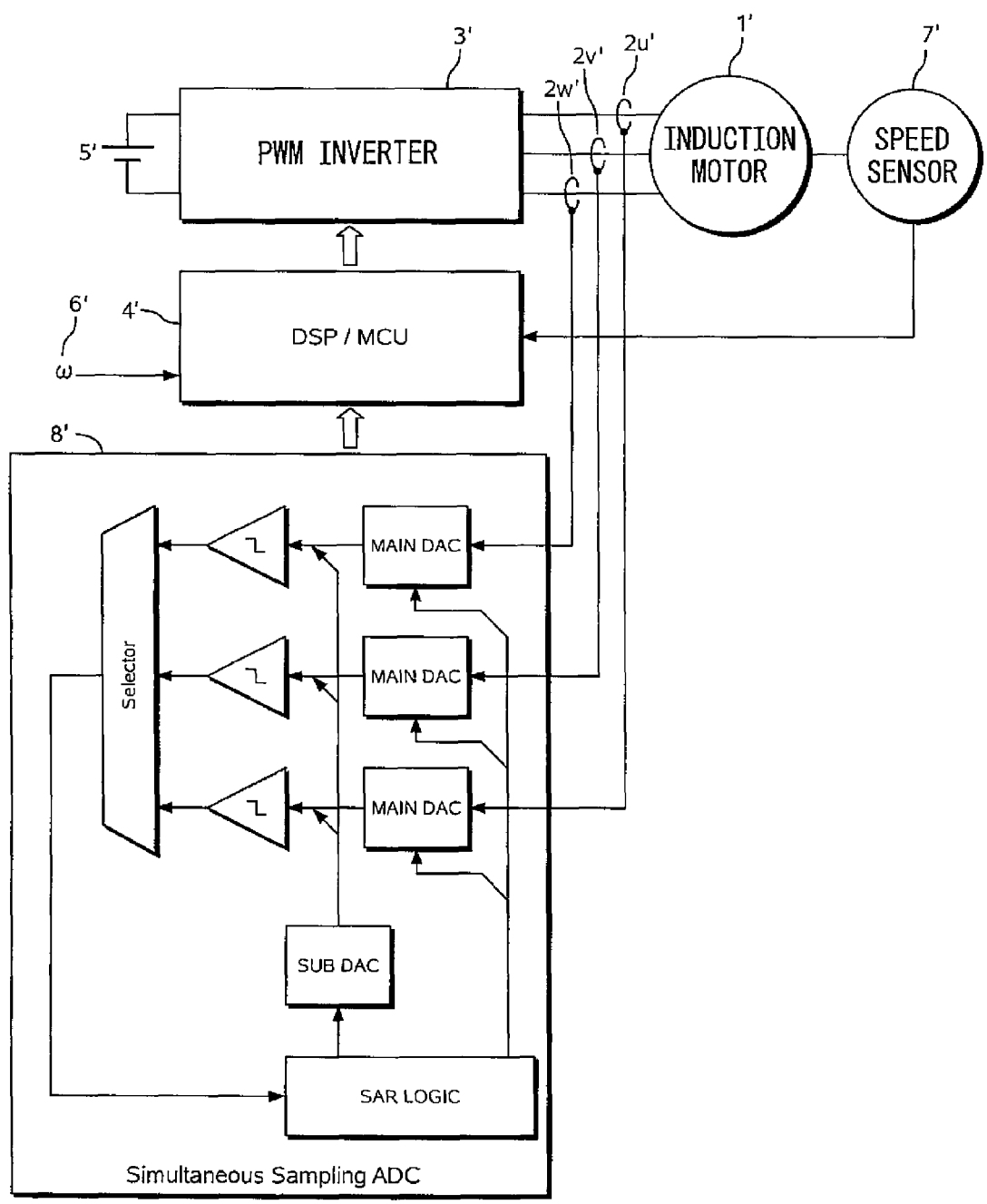
FIG. 29 is a diagram showing the configuration of the successive approximation A/D converter of the embodiment as applied to a system that drives an induction motor by vector control.

FIG. 29 shows a vector control system for the induction motor. The configuration is similar to that shown in FIG. 28, except that the control target 1' is the inductor motor and that the sensor 7' is a speed sensor for detecting the number of revolutions.

The control target is the induction motor 1', and information on the currents (2u', 2v', and 2w') flowing in the motor and an analog signal from the speed sensor 7' are supplied to the processor 4' via the A/D converter 8'. Based on the received information and the speed set value 6', the processor 4' performs signal processing, and controls the inverter device 3' accordingly. The inverter device drives the induction motor 1' by generating a voltage of PWM waveform based on the signal supplied from the processor 4'.

For the vector control of the induction motor also, a sensorless system can be employed that eliminates the need for the speed sensor. In this case, the speed sensor 7' shown in FIG. 29 is omitted.

By applying the successive approximation A/D converter of the embodiment to the A/D converter 8', the same beneficial effect as achieved for the permanent magnet synchronous motor can be obtained.

Compared with V/f constant control, the vector control of the induction motor can achieve high torque performance and can reduce speed variations associated with the load. When a comparison is made between the vector control using the speed sensor and the sensorless vector control, the sensorless scheme has the problem that the control performance drops due to the temperature variation of the primary resistor in the very slow speed range.

There are various configurations and algorithms for the vector control of the induction motor, and suitable ones are selected for use according to the purpose. Most applications require A/D conversion capable of multiple-channel simultaneous sampling, but by applying the A/D converter of the embodiment, a small-area, low current consuming system can be constructed.

The above describes an example in which the present embodiment is applied to the control of the permanent magnet synchronous motor or the control of the induction motor. Lastly, a description will be given of an example in which the A/D converter of the embodiment is applied to an R/D (Resolver to Digital) converter for converting an analog output representing an angle, output from an angle sensor called a resolver, into a digital value representing the angle.

In a motor control system, the resolver is mounted on the motor shaft in order to measure the motor speed or the rotor angle. The resolver is an angle sensor that features high reliability because of its simple structure. The resolver is a kind of transformer whose primary side is the rotor and whose secondary side is the stator. The stators are mounted in quadrature. When the primary side is energized, a voltage (VI, VQ) with an amplitude proportional to the angle θ between the stator and rotor is generated in the secondary side. This secondary voltage is A/D converted, and the angle is calculated by digital signal processing and output as angle information. In this case, the A/D converter must A/D convert the two voltages in quadrature by simultaneously sampling them.

The function for converting the analog signal output from the resolver into a digital signal representing the angle has been implemented in the form of an integrated circuit of an R/D converter and is available commercially.

The R/D converter incorporates two A/D converters for A/D converting the two channels VI and VQ.

Figure 30A:
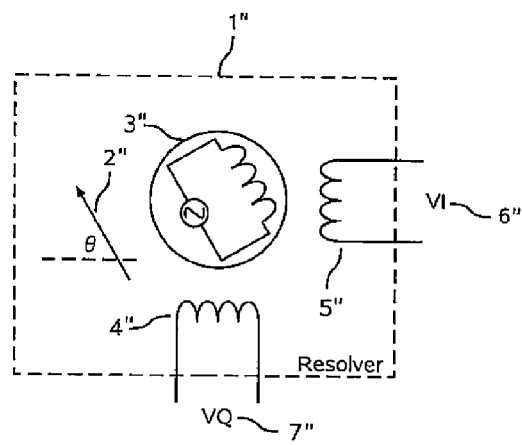
FIGS. 30A and 30B are diagrams showing the configuration of the successive approximation A/D converter of the embodiment as applied to a system that detects an angle using a resolver.
Figure 30B:
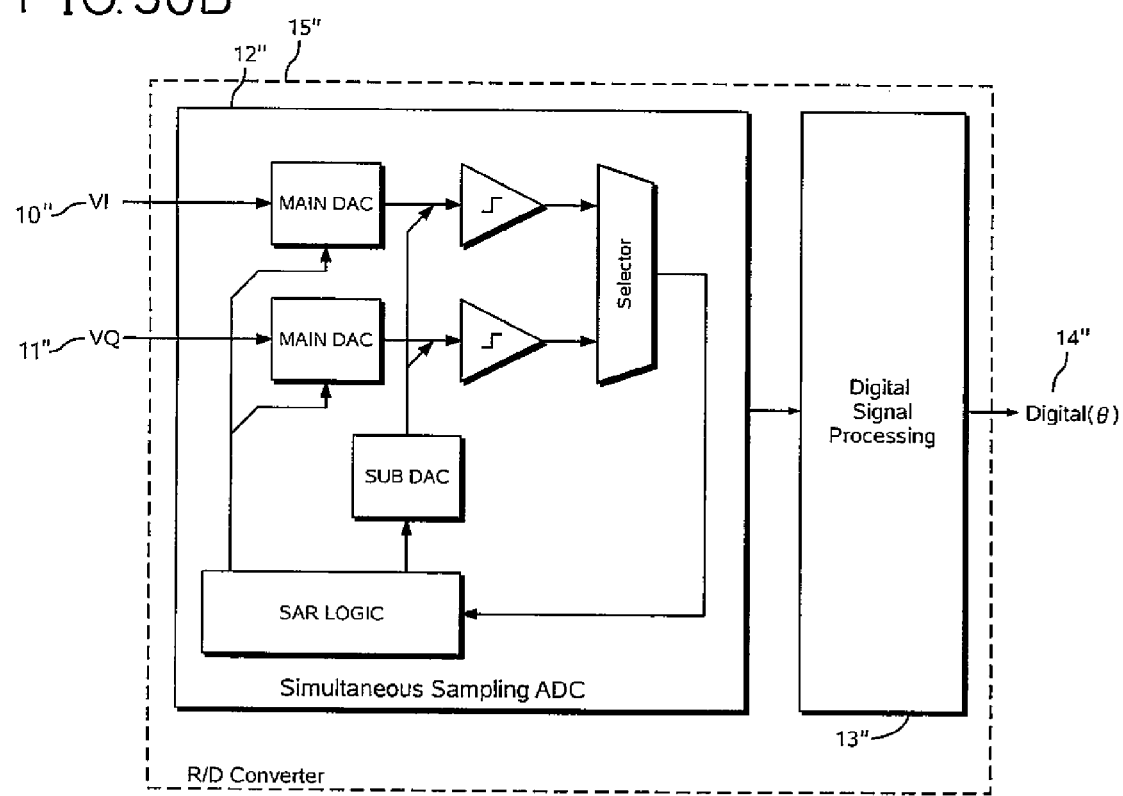

The A/D converter of the embodiment can also be applied to this application. FIGS. 30A and 30B show an example in which the A/D converter of the embodiment is applied to an angle detection system that uses a resolver and an R/D converter. In FIGS. 30A and 30B, reference numeral 1" is the resolver, 2" indicates the angle between the rotor and stator of the resolver, 3" is the rotor of the resolver, 4" and 5" are the stators of the resolver, 6" and 7" are analog voltage signals in quadrature output from the resolver, 10" and 11" are the analog voltage signals in quadrature supplied from the resolver to the R/D converter, 12" is an A/D converter having a two-channel simultaneous sampling function, 13" is a digital signal processing circuit for calculating the angle, 14" indicates the angle value output after digital conversion, and 15" is the R/D converter.

As shown in FIGS. 30A and 30B, the angle detection system using the resolver comprises the resolver 1" and the R/D converter 15" located downstream thereof. The R/D converter 15" comprises the simultaneous sampling A/D converter 12" and the digital signal processing circuit 13".

The rotor 3" which has an energizing function is mounted on the motor shaft. The stators 4" and 5" are mounted in quadrature, and the secondary voltages (6" and 7") proportional to the angles θ that the rotor makes with the respective stators are generated as the motor shaft rotates. The voltages (6" and 7") developed at the stators are converted into digital form by the A/D converter 12" having a simultaneous sampling function, and sent to the digital signal processing circuit 13". The digital signal processing circuit 13" calculates from the received signal the angles θ that the rotor of the revolver makes with the respective stators, and outputs the digital signal 14".

In this way, the A/D converter of the embodiment can be applied as the A/D converter for use in the R/D converter, and in this case also, a small-area R/D converter can be achieved, and thus the manufacturing cost can be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations can be made hereto without departing from the spirit and scope of the invention.

What is claimed is:

1. A successive approximation A/D conversion circuit for simultaneously sampling N channels of analog signals and for A/D converting the sampled analog signals, comprising:
    N capacitive DACs;
    a resistive DAC;
    N comparators; and
    a successive approximation control circuit, wherein
    the successive approximation control circuit determines high-order bit values of A/D conversion results of the N channels of analog signals by controlling the N capacitive DACs and the N comparators, and
    determines low-order bit values of the A/D conversion results of the N channels of analog signals by controlling the resistive DAC and the N comparators.

2. The successive approximation A/D conversion circuit according to claim 1, wherein the resistive DAC comprises:
    a resistor string; and
    a switch array comprising a plurality of switches each connected at one end to a connection node of the resistor string and at an opposite end to an output of the resistive DAC.

3. The successive approximation A/D conversion circuit according to claim 2, wherein the output of the resistive DAC is connected in common to the N capacitive DACs.

4. The successive approximation A/D conversion circuit according to claim 3, wherein
    the resistive DAC comprises a plurality of the switch arrays, and
    the plurality of switches in each of the switch arrays are connected at the opposite end to a corresponding one of the N capacitive DACs, and wherein
    when the switch arrays are smaller in number than the number N, the plurality of switches in one or some of the switch arrays are connected in common at the opposite end to some of the N capacitive DACs.

* * * * *